(12) United States Patent
Enatsu et al.

(10) Patent No.: US 9,840,791 B2
(45) Date of Patent: Dec. 12, 2017

(54) PERIODIC TABLE GROUP 13 METAL NITRIDE CRYSTALS AND METHOD FOR MANUFACTURING PERIODIC TABLE GROUP 13 METAL NITRIDE CRYSTALS

(71) Applicant: MITSUBISHI CHEMICAL CORPORATION, Chiyoda-ku (JP)

(72) Inventors: Yuuki Enatsu, Ushiku (JP); Satoru Nagao, Ushiku (JP); Shuichi Kubo, Ushiku (JP); Hirotaka Ikeda, Ushiku (JP); Kenji Fujito, Ushiku (JP)

(73) Assignee: MITSUBISHI CHEMICAL CORPORATION, Chiyoda-ku (JP)

(*) Notice: Subject to any disclaimer, the term of this patent is extended or adjusted under 35 U.S.C. 154(b) by 404 days.

(21) Appl. No.: 14/502,249

(22) Filed: Sep. 30, 2014

(65) Prior Publication Data

US 2015/0093318 A1    Apr. 2, 2015

Related U.S. Application Data

(63) Continuation of application No. PCT/JP2013/059631, filed on Mar. 29, 2013.

(30) Foreign Application Priority Data

Mar. 30, 2012  (JP) ................. 2012-081735
Mar. 30, 2012  (JP) ................. 2012-082153

(51) Int. Cl.
 *C30B 29/40* (2006.01)
 *C30B 25/02* (2006.01)
 (Continued)

(52) U.S. Cl.
 CPC .......... *C30B 29/406* (2013.01); *C30B 25/02* (2013.01); *C30B 25/14* (2013.01); *C30B 25/20* (2013.01);
 (Continued)

(58) Field of Classification Search
 None
 See application file for complete search history.

(56) References Cited

U.S. PATENT DOCUMENTS

2009/0039356 A1    2/2009  Iso et al.
2009/0155947 A1    6/2009  Paek et al.
(Continued)

FOREIGN PATENT DOCUMENTS

EP    2 154 272 A1    2/2010
JP    2006-315947    11/2006
(Continued)

OTHER PUBLICATIONS

International Preliminary Report on Patentability dated Oct. 9, 2014 in PCT/JP2013/059631 (English Translation only).
(Continued)

*Primary Examiner* — Guinever S Gregorio
(74) *Attorney, Agent, or Firm* — Oblon, McClelland, Maier & Neustadt, L.L.P.

(57) ABSTRACT

A periodic table Group 13 metal nitride crystals grown with a non-polar or semi-polar principal surface have numerous stacking faults. The purpose of the present invention is to provide a period table Group 13 metal nitride crystal wherein the occurrence of stacking faults of this kind are suppressed. The present invention achieves the foregoing by a periodic table Group 13 metal nitride crystal being characterized in that, in a Qx direction intensity profile that includes a maximum intensity and is derived from an isointensity contour plot obtained by x-ray reciprocal lattice mapping of (100) plane of the periodic table Group 13 metal nitride crystal, a Qx width at 1/300th of peak intensity is $6 \times 10^{-4}$ rlu or less.

17 Claims, 3 Drawing Sheets

(51) Int. Cl.
*H01L 21/02* (2006.01)
*C30B 25/14* (2006.01)
*C30B 25/20* (2006.01)
*H01L 29/20* (2006.01)

(52) U.S. Cl.
CPC ........ *C30B 29/403* (2013.01); *H01L 21/0254* (2013.01); *H01L 21/0262* (2013.01); *H01L 21/02389* (2013.01); *H01L 21/02433* (2013.01); *H01L 21/02634* (2013.01); *H01L 29/2003* (2013.01)

(56) References Cited

U.S. PATENT DOCUMENTS

| | | |
|---|---|---|
| 2009/0294909 A1 | 12/2009 | Nagai et al. |
| 2010/0148212 A1 | 6/2010 | Fujito et al. |
| 2010/0244087 A1 | 9/2010 | Horie et al. |
| 2011/0088756 A1 | 4/2011 | Fujii et al. |
| 2011/0216795 A1* | 9/2011 | Hsu ................. B82Y 20/00 372/44.011 |
| 2011/0237054 A1 | 9/2011 | Iso et al. |
| 2012/0034763 A1 | 2/2012 | Osada et al. |
| 2012/0305983 A1 | 12/2012 | Fujito et al. |
| 2013/0320394 A1 | 12/2013 | Fujito et al. |

FOREIGN PATENT DOCUMENTS

| | | |
|---|---|---|
| JP | 2009-147305 A | 7/2009 |
| JP | 2009-239250 A | 10/2009 |
| JP | 2010-013298 | 1/2010 |
| JP | 2010-536181 A | 11/2010 |
| JP | 2011-86814 A | 4/2011 |
| JP | 2011-86841 A | 4/2011 |
| JP | 2012-31028 A | 2/2012 |

OTHER PUBLICATIONS

Extended European Search Report dated Jun. 5, 2015 in Patent Application No. 13768539.2.
S.F. Chichibu, et al., "Optical properties of nearly stacking-fault-free m-plane GaN homoepitaxial films grown by metal organic vapor phase epitaxy on low defect density freestanding GaN substrates" Applied Physics Letters, vol. 92, No. 9, XP012108466, Mar. 7, 2008, 3 Pages.
M. Rudzinski, et al., "Growth of GaN epilayers on c-, m-, a-, and (20.1)-plane GaN bulk substrates obtained by ammonothermal method" Journal of Crystal Growth, vol. 328, No. 1, XP028241447, Jun. 13, 2011, pp. 5-12.
Office Action dated Feb. 5, 2016 in European Patent Application No. 13 768 539. 2.
Office Action dated Nov. 17, 2015 in Japanese Patent Application No. 2012-081735 (with English language translation).
International Search Report dated May 14, 2013 in PCT/JP2013/059631 filed Mar. 29, 2013.
Okamoto et al., Japanese Journal of Applied Physics, vol. 45, No. 45, 2006, pp. L1197-L1199.
Asamizu et al., Applied Physics Express 1, 2008, 091102.
Fujito et al., Phys. Stat. Sol. (a) 205, No. 5, 2008, pp. 1056-1059.
Iso et al., Japanese Journal of Applied Physics, vol. 46, No. 40, 2007, pp. L960-L962.
Hirai et al., Applied Physics Letters 91, 2007, 191906.
Asamizu et al., Applied Physics Express 2, 20019, 021002.

* cited by examiner

PERIODIC TABLE GROUP 13 METAL NITRIDE CRYSTALS AND METHOD FOR MANUFACTURING PERIODIC TABLE GROUP 13 METAL NITRIDE CRYSTALS

CROSS-REFERENCE TO RELATED APPLICATION

This is a continuation of International Application PCT/JP2013/059631, filed on Mar. 29, 2013, and designated the U.S., (and claims priority from Japanese Patent Application 2012-081735 which was filed on Mar. 30, 2012 and Japanese Patent Application 2012-082153 which was filed on Mar. 30, 2012,) the entire contents of which are incorporated herein by reference.

TECHNICAL FIELD

The present invention relates to a periodic table Group 13 metal nitride crystal and to a method of manufacturing a periodic table Group 13 metal nitride crystal. The invention relates in particular to a periodic table Group 13 metal nitride crystal in which the occurrence of stacking faults is suppressed and to a method of manufacturing such a crystal.

BACKGROUND ART

A nitride semiconductor represented by gallium nitride has large band gap, and interband transition is a direct transition. Therefore, the nitride semiconductor is a useful material for light emitting devices at relatively short wavelength side such as ultraviolet, blue or green light emitting diodes and semiconductor lasers, and semiconductor devices such as electronic devices. Light-emitting devices are generally produced by growing a Group 13 metal nitride crystal in the periodic table on a substrate. And it is known that when Group 13 metal nitride crystals in the periodic table are grown on different kinds of substrates, light-emitting devices having a good efficiency cannot be provided on account of the generation of stacking faults (see Non-patent Documents 1-4), while high-performance light-emitting devices can be provided when Group III metal nitride crystals in the periodic table are homoepitaxially grown on an independent substrate of periodic table Group 13 metal nitride having no stacking faults (see Non-patent Document 3). Hence, in order to provide high-performance light-emitting devices, there exists a need to provide periodic table Group 13 metal nitride crystals which are free of crystal faults such as stacking faults.

One typical method of producing a periodic table Group 13 metal nitride substrate entails the following. A crystal is homoepitaxially grown on a periodic table Group 13 metal nitride seed having a polar plane such as the (0001) plane as a principal plane, following which the crystal is machined so that the desired plane emerges, thereby giving a periodic table Group 13 metal nitride substrate having a specific plane as the principal plane. For example, after GaN has been homoepitaxially grown on the (0001) plane of a GaN crystal seed, by polishing or cutting the crystal so that the (10-10) plane emerges, it is possible to obtain a GaN semiconductor substrate in which the principal plane is the nonpolar (10-10) plane. GaN semiconductor substrates obtained by such a method have been confirmed to have few stacking faults (see Non-Patent Document 2 and Non-Patent Document 5). However, in methods of growing a crystal on a seed in which the principal plane is a polar plane, one challenge has been the difficulty of providing a large-size semiconductor substrate in which the principal plane is a plane other than such polar planes.

Compared with the foregoing method that makes use of a polar plane, very little literature exists on methods of homoepitaxially growing a crystal using a periodic table Group 13 metal nitride seed in which the principal plane is not a polar plane.

For example, Patent Document 1 describes the approach of fitting together nitride semiconductor bars whose principal plane is the M plane by means of raised and recessed features provided on the C plane serving as the side wall, and growing a nitride semiconductor layer on the resulting array of nitride semiconductor bars.

Patent Document 2 describes a method of manufacturing a high-grade nitride semiconductor crystal having a non-polar plane of large surface area, which method entails growing the crystal in the +C-axis direction of a seed crystal.

In addition, Patent Document 3 describes an example where a GaN thin-film in which (10-10) plane serves as the principal plane was grown on (10-10) plane of a sapphire substrate, following which a 1.5 mm thick GaN crystal was grown by a liquid phase process. The same document reports that the number of stacking faults in GaN crystals wherein the (10-10) plane served as the principal plane that were grown was $10^4$ cm$^{-1}$.

In addition, Patent Document 4 describes growing a 3 mm-thick GaN crystal by hydride vapor-phase epitaxy on a plurality of gallium nitride (GaN) crystal fragments in which the principal plane is a plane other than {0001} planes. Patent Document 5 describes growing a GaN crystal by hydride vapor-phase epitaxy on an underlying substrate having a principal plane with a misorientation angle relative to {1-100} planes of at least 4.1° and not more than 47.8°.

Patent Document 1: Japanese Patent Application Laid-open No. 2006-315947
Patent Document 2: Japanese Patent Application Laid-open No. 2008-308401
Patent Document 3: Japanese Patent Application Laid-open No. 2010-001209
Patent Document 4: Japanese Patent Application Laid-open No. 2010-013298
Patent Document 5: Japanese Patent Application Laid-open No. 2011-016676
Non-Patent Document 1: *Applied Physics Express* 1 (2008), 091102
Non-Patent Document 2: *Phy. stat. sol.* (a) 205, No. 5 (2008), 1056
Non-Patent Document 3: *JJAP* 46, No. 40 (2007), L960
Non-Patent Document 4: *Appl. Phys. Lett.* 91 (2007), 191906
Non-Patent Document 5: *Applied Physics Express* 2 (2009), 021002

DISCLOSURE OF THE INVENTION

As described above, although a method which homoepitaxially grows a crystal on a periodic table Group 13 metal nitride seed in which a polar plane serves as the principal plane, then cuts the crystal so that a desired plane emerges is able to obtain a periodic table Group 13 metal nitride substrate having few stacking faults, a large-size substrate cannot be obtained. On the other hand, when the inventors investigated the method which involves homoepitaxially growing a crystal on a periodic table Group 13 metal nitride seed in which a non-polar plane such as (10-10) plane serves as the principal plane, then cutting from this a substrate in which the (10-10) plane serves as the principal plane, it became apparent for the first time that if an attempt is made to produce a substrate by growing a thick-film crystal, the stacking faults become extremely numerous. That is, in the course of investigations by the inventors, it was found that when thick film growth has been carried out, compared with a Group 13 metal nitride crystal in the periodic table obtained by homoepitaxial growth on a periodic table Group III metal nitride seed in which (0001) plane serves as the principal plane, a Group 13 metal nitride crystal in the periodic table obtained by homoepitaxial growth on a periodic table Group 13 metal nitride seed in which (10-10) plane serves as the principal plane has many stacking faults.

In this way, it has not been possible with conventional methods to provide periodic table Group 13 metal nitride crystals which have few stacking faults and are moreover large in size.

Meanwhile, if it is possible to markedly suppress the generation of stacking faults, particularly in directions parallel to the polar plane, when homoepitaxial growth has been carried out on the principal plane of a substrate, it is thought that this would be extremely useful for the production of high-performing and high-efficiency light-emitting devices. However, no methods for providing such periodic table Group 13 metal nitride crystals have hitherto been proposed.

This invention provides, in a periodic table Group 13 metal nitride crystal grown on a periodic table Group 13 metal nitride underlying substrate having a non-polar or semi-polar plane as a principal plane, a crystal having few stacking faults, and also provides a method capable of manufacturing such a crystal.

The inventors have conducted extensive research in order to resolve the above problems, focusing on reciprocal lattice mapping, which is one method of measurement using x-ray diffraction of a crystal. In the course of this work, the inventors found that the condition of stacking faults within a crystal can be determined by (100) reciprocal lattice mapping the crystal, deriving an intensity profile in the Qx direction that includes a maximum intensity, and calculating the width at $1/300$th of peak intensity. Moreover, on variously investigating the crystal growth conditions, the inventors realized that, even in a periodic table Group 13 metal nitride crystal grown on a periodic table Group 13 metal nitride underlying substrate, stacking faults can be reduced to a level comparable to that in a crystal grown using the C plane as the principal plane, in which it is generally regarded that stacking faults do not arise.

The inventors also found that, in x-ray rocking curve measurement for crystals, the anisotropy of the crystal can be understood by comparing the (100) rocking curve obtained when x-rays enter the crystal perpendicular to the a-axis with the (100) rocking curve obtained when x-rays enter the crystal perpendicular to the c-axis, enabling the condition of stacking faults within the crystal to be determined. Moreover, on variously investigating the crystal growth conditions, the inventors realized that, even in a periodic table Group 13 metal nitride crystal grown on a periodic table Group 13 metal nitride underlying substrate, stacking faults can be reduced to a level comparable to that in a crystal grown using the C plane as the principal plane, in which it is generally regarded that stacking faults do not arise.

The inventors additionally found that by adjusting various growth conditions and thereby controlling the crystal growth mode, even in a periodic table Group 13 metal nitride crystal grown on a periodic table Group 13 metal nitride underlying substrate, stacking faults can be reduced to a level comparable to that in a crystal grown using the C plane as the principal plane, in which it is generally regarded that stacking faults do not arise.

Thus, the present invention provides the followings:

[1] A periodic table Group 13 metal nitride bulk crystal that is a periodic table Group 13 metal nitride crystal grown on a periodic table Group 13 metal nitride underlying substrate having a non-polar or semi-polar plane as a principal plane, the periodic table Group 13 metal nitride bulk crystal being characterized in that, in a Qx direction intensity profile that includes a maximum intensity and is derived from an isointensity contour plot obtained by x-ray reciprocal lattice mapping of (100) plane of the periodic table Group 13 metal nitride crystal, a Qx width at $1/300$th of peak intensity is $6 \times 10^{-4}$ rlu or less.

[2] The periodic table Group 13 metal nitride bulk crystal according to [1], characterized in that, in a Qx direction intensity profile that includes a maximum intensity and is derived from an isointensity contour plot obtained by x-ray reciprocal lattice mapping of (100) plane of the periodic table Group 13 metal nitride crystal, a Qx width at $1/1000$th of peak intensity is $1 \times 10^{-3}$ rlu or less.

[3] A periodic table Group 13 metal nitride bulk crystal that is a periodic table Group 13 metal nitride crystal grown on a periodic table Group 13 metal nitride underlying substrate having a non-polar or semi-polar plane as a principal plane, the bulk crystal being characterized in that a value calculated by dividing the width at $1/300$th of peak intensity of a (100) rocking curve obtained when x-rays enter the periodic table Group 13 metal nitride crystal perpendicular to the a-axis, by the width at $1/300$th of peak intensity of a (100) rocking curve obtained when x-rays enter the crystal perpendicular to the c-axis is 3 or less.

[4] The periodic table Group 13 metal nitride bulk crystal according to [3], characterized in that a value calculated by dividing the width at $1/1000$th of peak intensity of a (100) rocking curve obtained when x-rays enter the periodic table Group 13 metal nitride crystal perpendicular to the a-axis, by the width at $1/1000$th of peak intensity of a (100) rocking curve obtained when x-rays enter the crystal perpendicular to the c-axis is 3 or less.

[5] The periodic table Group 13 metal nitride bulk crystal according to [3] or [4], characterized in that a value calculated by dividing the full width at half peak intensity of the (100) rocking curve obtained when x-rays enter the periodic table Group 13 metal nitride crystal perpendicular to the a-axis, by the full width at half peak intensity of the (100) rocking curve obtained when x-rays enter the crystal perpendicular to the c-axis is 4 or less.

[6] The periodic table Group 13 metal nitride bulk crystal according to any one of [1] to [5], characterized in that the number of stacking faults visible in cathodoluminescence imaging is $3 \times 10^3$/cm or less.

[7] The periodic table Group 13 metal nitride bulk crystal according to any one of [1] to [6], characterized in that a c-axis misorientation angle distribution at a distance of 40 mm is within $\pm 0.5°$.

[8] A substrate made of the periodic table Group 13 metal nitride bulk crystal according to any one of [1] to [7].

[9] A semiconductor device, which uses the substrate according to [8].

Furthermore, another mode of the present invention provides the followings:

[10] A method of manufacturing a periodic table Group 13 metal nitride bulk crystal, comprising the step of growing, by a vapor-phase process, a periodic table Group 13 metal nitride layer on a periodic table Group 13 metal nitride underlying substrate having a non-polar or semi-polar plane as a principal plane, the method being characterized in that, at an early stage of the growth step, the periodic table Group 13 metal nitride layer is two-dimensionally grown or step-flow grown.

[11] A method of manufacturing a periodic table Group 13 metal nitride bulk crystal, comprising the step of growing, by a vapor-phase process, a periodic table Group 13 metal nitride layer on a periodic table Group 13 metal nitride underlying substrate having a principal plane that is a plane tilted at least 1.5° in the [0001] or [000-1] direction from the (10-10) plane, the method being characterized in that, in the growth step, the periodic table Group 13 metal nitride layer is grown in an atmosphere where at least 40 volt of a total gas flow rate is an inert gas.

[12] The method of manufacturing a periodic table Group 13 metal nitride bulk crystal according to [10] or [11], characterized in that the principal plane of the underlying substrate is a plane tilted at least 1.5° in the [000-1] direction from the (10-10) plane.

[13] The method of manufacturing a periodic table Group 13 metal nitride bulk crystal according to any one of [10] to [12], characterized in that the vapor-phase process is hydride vapor-phase epitaxy (HVPE).

[14] The method of manufacturing a periodic table Group 13 metal nitride bulk crystal according to any one of [10] to [13], characterized in that the underlying substrate is made of one single crystal of a periodic table Group 13 metal nitride.

[15] The method of manufacturing a periodic table Group 13 metal nitride bulk crystal according to any one of [10] to [14], characterized in that growth temperature in the growth step is 1040° C. or below.

[16] The method of manufacturing a periodic table Group 13 metal nitride bulk crystal according to any one of [10] to [15], characterized in that, in the growth step, a periodic table Group 13 source and a nitrogen source are each fed as a gas and the density ratio of the periodic table Group 13 source-containing gas (periodic table Group 13 source gas) to the nitrogen source-containing gas (nitrogen source gas), expressed as "periodic table Group 13 source gas density/nitrogen source gas density," is set to less than 1.

The periodic table Group 13 metal nitride crystal of the invention, in spite of having a non-polar or semi-polar plane as the principal plane, enables a good-quality periodic table Group 13 metal nitride crystal with fewer stacking faults to be provided.

In addition, by using the method for producing Group 13 metal nitride crystals in the periodic table according to the present invention, it is possible to easily produce Group 13 metal nitride crystals in the periodic table which are large in size and have few stacking faults and in which a non-polar plane or a semi-polar plane serves as the principal plane. By using, as a semiconductor substrate, the Group 13 metal nitride crystals in the periodic table thus produced and carrying out homoepitaxial growth on a principal plane of the semiconductor substrate, it is possible to obtain a crystal which has few stacking faults and in which stacking faults in directions parallel to a polar plane in particular have been markedly suppressed. As a result, by utilizing the present invention, it is possible to provide semiconductor light-emitting devices having a high light-emitting intensity and an excellent durability.

BEST MODE FOR CARRYING OUT THE INVENTION

Figure 1:
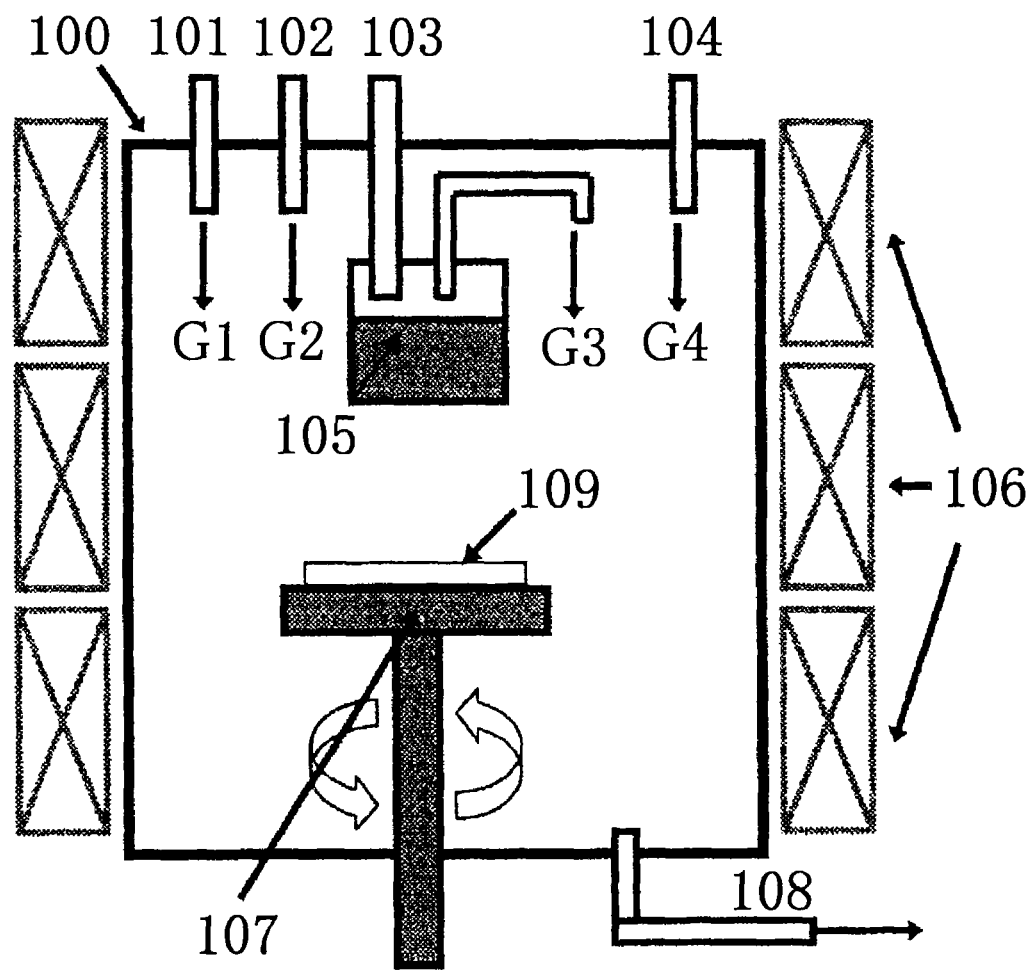
FIG. 1 is a schematic diagram showing the crystal growing system used in the working examples of the invention.
Figure 2:
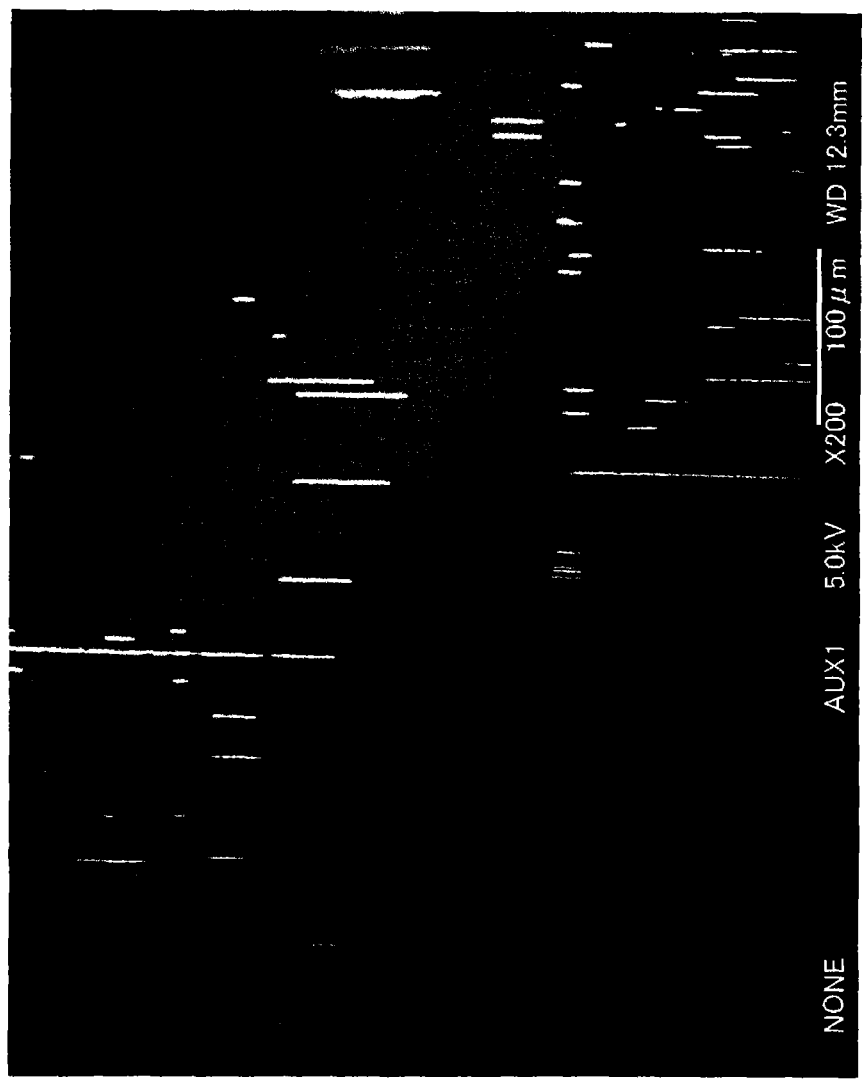
FIG. 2 is a cathodoluminescence image of a crystal grown in a working example of the invention (photograph provided in place of diagram).

The periodic table Group 13 metal nitride crystal of the invention and the inventive method of manufacturing a periodic table Group 13 metal nitride crystal are described in detail below. The explanation of constituent elements may be made based on the representative embodiment of the present invention, but the present invention is not limited to only such an embodiment.

Numerical range represented using "from . . . to" in the present specification means a range including the numerical values described after "from" and after "to" as a lower limit and an upper limit, respectively.

In this specification, when a Miller index is negative, the index is preceded by a minus sign.

As used herein, <....> denotes a group of directions and [....] denotes an individual direction. Also, {....} denotes a group of planes and (....) denotes an individual plane.

Also, in the specification, "off angle" refers to an angle representing the slippage of a given plane from an index plane.

In the present specification, "principal plane" is the largest (broadest) plane in the structure, and refers to the plane where crystal growth should be carried out. In this description of the present application, the term "C plane" means the (0001) plane of a hexagonal structure (wurtzite crystal structure), the plane being perpendicular to the c axis. Such planes are polar planes; in a periodic table Group 13 metal nitride crystal, the "+C plane" is the periodic table Group 13 metal plane (in the case of gallium nitride, the gallium plane), and the "−C plane" is the nitrogen plane.

Moreover, in the specification, "M-plane" refers to planes which are equivalent to {1-100} plane, and refers specifically to (1-100) plane, (01-10) plane, (−1010) plane, (−1100) plane, (0-110) plane, or (10-10) plane, each of which is perpendicular to the m axis. Such planes are non-polar planes, and are generally cleavage planes.

Moreover, in the specification, "A-plane" refers to planes which are equivalent to {2-1-10} plane, and refers specifically to (2-1-10) plane, (−12-10) plane, (−1-120) plane, (−2110) plane, (1-210) plane, or (11-20) plane, each of which is perpendicular to the a axis. Such planes are non-polar planes.

Further, in this specification, "c axis," "m axis" and "a axis" refer to axes that are perpendicular to, respectively, a C plane, an M plane and an A plane.

Furthermore, in the specification, "semi-polar plane" refers to, in a case where the Group 13 metal nitride crystal in the periodic table is a hexagonal crystal whose principal plane is represented as (hklm), for example, a plane where at least two from among h, k and l are not 0, and m is not 0. Also, a semi-polar plane refers to a plane which is tilted with respect to a C plane such as (0001) plane, and which, in cases where both a Group 13 element in the periodic table and nitrogen are present at the surface or only one of these is present, has an abundance ratio therebetween which is not 1:1. Also, h, k, l and m are each independently any integer which is preferably from −5 to 5, and more preferably from −3 to 3, and the semi-polar plane is preferably a low-index plane. Specific examples include low-index planes such as {20-21} planes, {20-2-1} planes, {30-31} planes, {30-3-1} planes, {10-11} planes, {10-1-1} planes, {10-12} planes, {10-1-2} planes, {11-22} planes, {11-2-2} planes, {11-21} planes and {11-2-1} planes.

The periodic table Group 13 metal nitride crystal of the invention is a periodic table Group 13 metal nitride crystal obtained by growing a periodic table Group 13 metal nitride semiconductor layer on a periodic table Group 13 metal nitride underlying substrate having a non-polar or semi-polar plane as a principal plane. The principal plane of the periodic table Group 13 metal nitride crystal that has been grown is preferably a non-polar plane or a semi-polar plane. Examples of non-polar planes include {11-20} planes and {10-10} planes, with {10-10} planes being preferred. Preferred semi-polar planes include planes for which the normal vector is tilted by an angle of at least 5° and not more than 50° in the c-axis direction from a {10-10} plane. Of these, planes tilted by an angle of at least 6° and not more than 30° are more preferred, and planes tilted by an angle of at least 7° and not more than 15° are even more preferred. Other preferred semi-polar planes include planes tilted by an angle at least 5° and not more than 50° in the a-axis direction from a {10-10} plane, with planes tilted by an angle of at least 10° and not more than 40° being more preferred, and planes tilted by an angle of at least 15° and not more than 35° being still more preferred. Specifically, {30-31} planes, {30-3-1} planes, {20-21} planes, {20-2-1} planes, {10-11} planes, {10-1-1} planes, {40-41} planes, {40-4-1} planes, {50-51} planes and {50-5-1} planes are more preferred, with {30-31} planes, {30-3-1} planes, {20-21} planes, {20-2-1} planes, {10-11} planes and {10-1-1} planes being still more preferred.

This invention provides, in a periodic table Group 13 metal nitride crystal produced by crystal growth using a non-polar or semi-polar plane as the principal plane, in which growth numerous stacking faults have hitherto formed, a periodic table Group 13 metal nitride crystal having fewer stacking faults.

The periodic table Group 13 metal nitride crystal of the invention is characterized in that, in a Qx direction intensity profile that includes a maximum intensity and is derived from an isointensity contour plot obtained by x-ray reciprocal lattice mapping of the (100) plane of the crystal, the Qx width at $\frac{1}{300}$th of peak intensity ($Qx_{1/300}$) is $6 \times 10^{-4}$ rlu or less.

X-ray reciprocal lattice mapping is one type of measurement that uses x-ray diffraction to measure crystallinity and the state of lattice strain. The inventors have discovered that by x-ray reciprocal lattice mapping the (100) plane of a crystal, stacking faults within the crystal can be understood.

Specifically, when the Qx direction intensity profile that includes a maximum intensity and is derived from an isointensity contour plot obtained by x-ray reciprocal lattice mapping the (100) plane of the crystal is plotted onto a graph of the Qx direction as the abscissa and the intensity as the ordinate, a curve in the shape of a peak, or mountain, appears. Upon examining the Qx width at $\frac{1}{300}$th the maximum intensity of this peak (the peak intensity), the inventors have discovered that crystals in which this Qx width is $6 \times 10^{-4}$ rlu or less are crystals having few stacking faults.

In x-ray reciprocal lattice mapping the (100) plane of the crystal, the x-rays enter the crystal from a direction orthogonal to the a-axis, making it easy to understand basal plane stacking faults, which are stacking defects in the c-axis direction. Hence, in this invention, the x-ray reciprocal lattice mapping of the (100) plane of the crystal is carried out.

Also, in an isointensity contour plot obtained by reciprocal lattice mapping, because an x-ray 2θ-ω two-axis scan is measured in angular steps of 0.005° for both 2θ and ω over a measurement angle range of 1°, the measurement step (measurement width) in the Qy direction becomes $3 \times 10^{-3}$ rlu, and the Qx direction intensity in this measurement width appears. By deriving from this an intensity profile in the Qx direction that includes the maximum intensity, precise measurement of the intensity is possible.

By taking the derived profile and plotting it on a graph of the Qx direction as the abscissa and the intensity as the ordinate, the profile becomes a peak-shaped curve, and the Qx width at $\frac{1}{300}$th of peak intensity is measured.

The Qx width at $\frac{1}{300}$th of peak intensity, when measured, is $6 \times 10^{-4}$ rlu or less. Hence, the periodic table Group 13 metal nitride crystal of the invention can be regarded as a crystal in which stacking faults have been suppressed. This Qx width is preferably not more than $4 \times 10^{-4}$ rlu and more preferably not more than $3 \times 10^{-4}$ rlu.

Preferably, the periodic table Group 13 metal nitride crystal of the invention has, in the Qx direction intensity profile that includes a maximum intensity and is derived from an isointensity contour plot obtained by x-ray reciprocal lattice mapping the (100) plane of the crystal, a Qx width at $\frac{1}{1000}$th ($Qx_{1/1000}$) of peak intensity of $1 \times 10^{-3}$ rlu or less. This Qx width is preferably not more than $7 \times 10^{-4}$ rlu and more preferably not more than $5 \times 10^{-4}$ rlu.

The inventors have confirmed that the Qx width at $\frac{1}{300}$th of peak intensity ($Qx_{1/300}$) and the Qx width at $\frac{1}{1000}$th of peak intensity ($Qx_{1/1000}$) show a high correlation with the absence or presence of stacking faults.

The full width at half maximum (FWHM) is often used in the evaluation of curves having a peak-like shape. However, the inventors, having observed that the FWHM of the Qx profile also reflects at the same time the influence of dislocations other than stacking faults, have found as a result that the correlation with the stacking fault density is not always good. By contrast, the spectral width at the foot of the peak-shaped curve created by taking a profile of Qx was found to correlate well with the stacking fault density.

Qx width of the present invention is measured as follows.

Generally, in reciprocal lattice mapping measurement, 2θ is set at a given value and rocking curve (ω scan) measurement is carried out, then a small change is made in the 2θ value and rocking curve measurement is again carried out, this process being carried out repeatedly. In so doing, a high angular resolution for 2θ and ω is desirable. Hence, it is desirable for an x-ray mirror or a two-crystal monochromator and a four-crystal monochromator, or for a combination of these, to be disposed on the incident x-ray side so that parallelism and monochromaticity of the incoming x-rays is achieved. It is also desirable to place a so-called analyzer crystal on the detector side. Alternatively, as with measurement in the working examples of this invention, a one-dimensional array-type semiconductor device having a high angular resolution may be used as the detector. Using such an x-ray diffraction apparatus, first, x-rays are made to enter the crystal in a direction perpendicular to the a-axis and (100) plane reciprocal lattice mapping is carried out. Also, to eliminate the influence of curvature (warpage) of the crystal plane on the diffraction peak, it is necessary to suitably narrow, using a slit or the like, the x-ray beam diameter in the directions orthogonal to the ω rotational axis. Intensity mapping in the resulting 2θ-ω space is converted to intensity mapping in the Qx-Qy space. An intensity line profile in the Qx direction which passes through the maximum value in the Qy direction is derived from the reciprocal lattice mapping data thus obtained, giving the Qx width. In this invention, an x-ray 2θ-ω two-axis scan can be measured in angular steps of 0.005° for both 2θ and ω over a measurement angle range of 1°.

The intensity in the resulting Qx direction intensity profile that includes a maximum intensity and is derived from the isointensity contour plot is examined and the above-mentioned ⅓₀₀th and ¹⁄₁₀₀₀th intensity values are calculated.

A crystal wherein the $Qx_{1/300}$ and $Qx_{1/1000}$ values for the periodic table Group 13 metal nitride crystal of the invention fall within the above ranges can be obtained by employing two-dimensional growth or step-flow growth as the crystal growing mode. More specifically, this can be achieved by growing the crystal at a relatively low temperature at the initial stage of growth (0 to 15 minutes) and/or during the main stage of crystal growth, by using an inert gas as the carrier gas from before the start of the reaction until growth is complete, or by having the misorientation angle of the principal plane of the underlying substrate fall in a given range. By employing such conditions, warpage of the crystal planes also tends to become smaller.

The same can be achieved as well by carrying out, in crystal growth, lateral growth that causes the crystal to grow in a direction perpendicular to the direction in which the crystal thickness increases for the crystal as a whole, and collecting the regions that have formed by lateral growth after removing the seed crystal, regions that have formed on the principal plane of the seed crystal and regions that have formed by lateral growth from sidewalls of the seed crystal. Lateral growth can be controlled by means of such parameters as temperature, source gas partial pressure, nitrogen source/periodic table Group 13 metal source ratio, and source gas feed port-crystal growth end distance. In lateral crystal growth, the gas addition time at the start of growth is generally at least 10 seconds, preferably at least 20 seconds, and more preferably at least 30 seconds, and is generally not more than 10 minutes, preferably not more than 5 minutes, and more preferably not more than 2 minutes.

The periodic table Group 13 metal nitride crystal according to another aspect of the invention is characterized in that a value calculated by dividing the width at ⅓₀₀th of peak intensity of a (100) rocking curve obtained when x-rays enter the periodic table Group 13 metal nitride crystal perpendicular to the a-axis, by the width at ⅓₀₀th of peak intensity of a (100) rocking curve obtained when x-rays enter the crystal perpendicular to the c-axis is 3 or less, preferably 2 or less, and more preferably 1.5 or less.

A value calculated by dividing the width at ¹⁄₁₀₀₀th of peak intensity of a (100) rocking curve obtained when x-rays enter the periodic table Group 13 metal nitride crystal perpendicular to the a-axis, by the width at ¹⁄₁₀₀₀th of peak intensity of a (100) rocking curve obtained when x-rays enter the crystal perpendicular to the c-axis is 3 or less, preferably 2 or less, and more preferably 1.5 or less.

A value calculated by dividing the full width at half peak intensity of the (100) rocking curve obtained when x-rays enter the periodic table Group 13 metal nitride crystal perpendicular to the a-axis, by the full width at half peak intensity of the (100) rocking curve obtained when x-rays enter the crystal perpendicular to the c-axis is 4 or less, preferably 3 or less, and more preferably 2 or less.

In a periodic table Group 13 metal nitride crystal according to yet another aspect of the invention, by setting the ratio between the respective widths at ⅓₀₀th of peak intensity to a specific value when x-rays enter the crystal perpendicular to the a-axis and when x-rays enter the crystal perpendicular to the c-axis in x-ray rocking curve measurement of the (100) plane, a crystal having fewer stacking faults can be provided. It appeared conceivable that the rocking curve values thus measured when x-rays enter a periodic table Group 13 metal nitride crystal perpendicular to the a-axis and when x-rays enter the crystal perpendicular to the c-axis express the anisotropy of the crystal. Hence, the inventors realized that, in cases where the value calculated by dividing the width at ⅓₀₀th of peak intensity of a (100) rocking curve obtained when x-rays enter the periodic table Group 13 metal nitride crystal perpendicular to the a-axis by the width at ⅓₀₀th of peak intensity of a (100) rocking curve obtained when x-rays enter the periodic table Group 13 metal nitride crystal perpendicular to the c-axis is 3 or less, that is, in cases where the crystal anisotropy is small, the number of stacking faults in the crystal obtained is reduced.

The periodic table Group 13 metal nitride crystal in still another aspect of the invention has a value calculated by dividing the width at ¹⁄₁₀₀₀th of peak intensity of a (100) rocking curve obtained when x-rays enter the periodic table Group 13 metal nitride crystal perpendicular to the a-axis by the width at ¹⁄₁₀₀₀th of peak intensity of a (100) rocking curve obtained when x-rays enter the crystal perpendicular to the c-axis which is preferably 3 or less, or has a value obtained by dividing the full width at half of the peak intensity of a (100) rocking curve obtained when x-rays enter the periodic table Group 13 metal nitride crystal perpendicular to the a-axis by the full width at half of the peak intensity of a (100) rocking curve obtained when x-rays enter the periodic table Group 13 metal nitride crystal perpendicular to the c-axis which is preferably 4 or less.

Because x-ray rocking curve measurement is a method that can be measured more easily than the above-described $Qx_{1/300}$ and $Qx_{1/1000}$, it allows one to determine, by measurement of the crystal anisotropy in such x-ray rocking curve measurement, whether the $Qx_{1/300}$ and $Qx_{1/1000}$ of this invention are in the ranges of the invention.

It is preferable for the periodic table Group 13 metal nitride crystal of the invention to have not more than $1 \times 10^3$/cm basal plane stacking faults that are actually visible under cathodoluminescence imaging. Periodic table Group 13 metal nitride crystals which satisfy the $Qx_{1/300}$ condition of this invention are, as noted before, crystals in which the number of basal plane stacking faults has been reduced; the number of basal plane stacking faults visible in cathodoluminescence imaging tends to be $3 \times 10^3$/cm or less. This Qx width is preferably not more than $1 \times 10^3$/cm and more preferably not more than $2 \times 10^2$/cm.

The periodic table Group 13 metal nitride crystal according to another aspect of the invention has a value calculated by dividing the width at ⅓₀₀th of peak intensity of a (100) x-ray rocking curve by the width at ⅓₀₀th of peak intensity of a (300) x-ray rocking curve which is preferably 1.5 or less, more preferably 1.0 or less, and even more preferably 0.5 or less. By setting the value to the above upper limit or less, a crystal having fewer stacking faults can be provided. The incident direction of the x-rays at this time is made perpendicular to the a-axis.

Because stacking faults are planar defects that exist parallel to the (0001) plane (i.e., the C plane), which is a polar plane, by examining a cross-section that intersects the polar plane (especially a cross-section perpendicular to the polar plane), the stacking faults can be confirmed as linear bright lines. The stacking faults can be observed by examining the crystal surface with a fluorescence microscope or by low-temperature cathodoluminescence (CL) imaging at 100 K or below. Specifically, by producing a LED structure that emits 405 nm light at the crystal surface where one wishes to observe stacking faults and examining an image of this surface with a fluorescence microscope, stacking fault sites can be seen as bright lines. Also, the stacking faults in low-temperature CL appear as dark lines in wavelength resolution imaging with the wavelength fixed at the near band-edge luminescence wavelength (in an undoped layer obtained by metal organic chemical vapor deposition (MOCVD), this is generally the wavelength of neutral donor bound exciton emission), and appear as bright lines in wavelength resolution imaging with the wavelength fixed at the peak (approximately 364 nm) of emission from basal plane stacking faults. Those lines having a length of at least 5 μm in the a-axis direction that are observed at the surface in particular are treated in this invention as stacking faults.

The periodic table Group 13 metal nitride crystal of the invention has a ratio of 3.41 eV peak intensity from stacking faults I(BSF) to 3.47 eV peak intensity from band-edge luminescence $I(D^0X_A)$ (the intensities here being low-temperature PL intensities), expressed as $I(BSF)/I(D^0X_A)$, which is preferably 0.1 or less, more preferably 0.01 or less, and even more preferably 0.005 or less. Furthermore, threading dislocation density of the Group 13 metal nitride crystals in the periodic table of the present invention is preferably $10^8/cm^2$ or less, more preferably $10^7/cm^2$ or less, even more preferably $10^6/cm^2$ or less.

Generally, in cases where a periodic table Group 13 metal nitride layer of the same type as the underlying substrate has been grown by a process such as hydride vapor-phase epitaxy (HVPE) on an underlying substrate that has a non-polar or semi-polar plane as the principal plane and was fabricated by slicing at a specific angle or in a specific direction a crystal obtained by crystal growth in the c-axis direction on the C plane, the number of stacking faults intrinsic to the grown crystal is higher than the number of stacking faults intrinsic to the underlying substrate. For example, in the underlying substrate, the number of stacking faults is small and the bright lines observed are short, and so the bright line density is small. However, in the grown crystal, the number of stacking faults increases and the bright lines observed are longer, and so the bright line density is larger. Hence, as the growth of periodic table Group 13 metal nitride layer proceeds, the stacking faults expand, and it is thought to be possible that faults not observed in the seed crystal will newly emerge in the periodic table Group 13 metal nitride layer. When carrying out thick-film growth, the rise in the number of stacking faults has posed a serious problem.

In the periodic table Group 13 metal nitride crystals of this invention, warpage of the crystal planes tends to limited. Specifically, the misorientation angle distribution at a distance of 40 mm is preferably within ±1°, with a misorientation angle distribution within ±0.5° being more preferred.

For example, when the misorientation angle distribution in the c-axis direction is measured for a sample in which the M plane is the principal plane, x-rays are made to enter the sample perpendicular to the a-axis and a x-ray rocking curve of, for example, the (100) plane is measured at numerous points at set intervals along the c-axis direction. The amount of change in ω per unit length is determined from the relationship between the measurement positions and the ω peak. From this, it is possible to determine the misorientation angle distribution corresponding to a distance of 40 mm. Yet, in the case of a crystal having a size such that the maximum length of the principal plane is about several hundred microns, because the crystal is small compared with the beam size in an ordinary x-ray system, the measurements described above are difficult to carry out. However, by employing an x-ray source which uses emitted light generated with an accelerator, a beam having a diameter on the order of several microns can be obtained, thus enabling measurement of the misorientation angle distribution per unit length within crystals of the above sizes. It is possible in this way to determine the misorientation angle distribution corresponding to a distance of 40 mm.

Thus, the periodic table Group 13 metal nitride crystal of the invention is a crystal having a reduced number of stacking faults and little crystal lattice warpage. In the practice of this invention, in periodic table Group 13 metal nitride crystals grown with a non-polar or semi-polar plane as the principal plane, it is possible to provide crystals having a reduced number of stacking faults.

The periodic table Group 13 metal nitride crystal of the invention is a crystal grown on a periodic table Group 13 metal nitride underlying substrate having a non-polar or semi-polar plane as the principal plane, although the underlying substrate is otherwise not particularly limited, provided it is made of a periodic table Group 13 metal nitride. Examples of kinds of Group 13 metal nitrides in the periodic table include gallium nitride (GaN), aluminum nitride (AlN), indium nitride (InN), and mixed crystals thereof. It is especially preferable to select a seed crystal made of the same type of periodic table Group 13 metal nitride as the periodic table Group 13 metal nitride crystal of the invention. For example, in cases where the periodic table Group 13 metal nitride crystal is gallium nitride (GaN), an underlying substrate made of gallium nitride (GaN) is used. However, it is not necessary for the base substrate and the periodic table Group 13 metal nitride layer to have a completely identical composition; so long as the compositions are at least 99.75% (atomic ratio) in agreement, they may be regarded here as being the same kind of Group 13 metal nitrides in the periodic table. For example, in a case where a periodic table Group 13 metal nitride layer doped with silicon, oxygen or the like is grown on a seed crystal composed of GaN, this is regarded as growing the same kind of Group 13 metal nitride in the periodic table and is thus referred to as homoepitaxial growth.

The size of the principal plane of the underlying substrate may be suitably selected according to the size of the target periodic table Group 13 metal nitride crystal, although the surface area of the principal plane is preferably at least 2.5 $cm^2$, and more preferably at least 20 $cm^2$.

In the practice of the invention, aside from using one single crystal of a periodic table Group 13 metal nitride as the underlying substrate, it is also possible for a plurality of periodic table Group 13 metal nitride seed crystals to be used in combination as the underlying substrate. In one example of a method that may be used, plates having a non-polar or semi-polar plane as the principal plane are cut out as seed crystals from a periodic table Group 13 metal nitride crystal having the C plane as the principal plane, and a plurality of these seed crystals are arranged to form the underlying substrate (this is referred to as the "tile method"). In another example, a single periodic table Group 13 metal nitride crystal having a non-polar or semi-polar plane as the principal plane (which crystal is referred to below as the "mother seed") is produced from a larger crystal than those obtained by the tile method, and is used as the underlying substrate. With these methods, even in cases where a large underlying substrate cannot be furnished for crystal growing, it is possible to obtain a periodic table Group 13 metal nitride crystal having a large surface area. So long as the principal plane of the underlying substrate formed by arranging together a plurality of seed crystals is a non-polar or semi-polar plane overall, it may be either heterogeneous or homogeneous in-plane.

The tile method includes the steps of preparing a plurality of seed crystals having a non-polar or semi-polar plane as the principal plane, arranging together the plurality of seed crystals, and growing a periodic table Group 13 metal nitride crystal on the seed crystals.

The method that uses a mother seed includes the steps of furnishing a plurality of seed crystals having a non-polar or semi-polar plane as the principal plane, arranging together the plurality of seed crystals, growing a periodic table Group 13 metal nitride layer on the seed crystals, producing a mother seed having a non-polar or semi-polar plane as the principal plane from the resulting periodic table Group 13 metal nitride semiconductor layer, and growing a periodic table Group 13 metal nitride crystal on the mother seed.

Seed crystals having the same index plane or a combination of seed crystals having different index planes may be used as the plurality of seed crystals. When arranging together a plurality of seed crystals, the seed crystals are arranged so that the crystal orientations are on the same plane, with neighboring seed crystals either in mutual contact or not in contact. Because "crystal orientation" refers here to the inclination of the direction of the normal to the principal plane in each seed crystal, aligning the crystal orientations means to align the off angles among the seed crystals.

In particular, to achieve uniformity in the resulting Group 13 metal nitride crystals in the periodic table, the principal planes among the seed crystals have a distribution of plane directions that is preferably within ±5°, more preferably within +3°, even more preferably within +1°, and most preferably within ±0.5°. Because "plane direction" refers to the inclination of the direction of the normal to the principal plane in each seed crystal, a distribution of plane directions being within ±5° means the same thing as an off-angle being within ±5°.

The method for arranging a plurality of seed crystals is not particularly limited; the seed crystals may be arranged next to each other on the same flat surface or they may be arranged next to each other by planar stacking. In cases where the principal planes of the plurality of seed crystals have differing plane directions, arranging the seeds so that the plane directions of their respective principal planes face in the same direction is preferred because the Group 13 metal nitride crystals in the periodic table obtained tends to have a good crystallinity over seed crystal junctions. Also, when a plurality of seed crystals are arranged, it is preferable for the directions of the lines of intersections between the principal plane and the polar plane for the respective seed crystals to be aligned. Moreover, the distribution in the directions of the lines of intersection between the principal plane and the polar plane for the respective seed crystals is set to preferably within ±5°, more preferably within ±3°, even more preferably within +1°, and particularly preferably within +0.5°.

So long as the periodic table Group 13 metal nitride crystal of the invention is a crystal that satisfies the essential features described above, the method of manufacture is not particularly limited. For example, manufacture may be carried out by a method that includes as the crystal growing step a known crystal growing method such as:
(1) hydride vapor-phase epitaxy (HVPE);
(2) metal organic chemical vapor deposition (MOCVD);
(3) metal organic chloride vapor phase growth (MOC);
(4) sublimation;
(5) liquid phase epitaxy (LPE); and
(6) ammonothermal growth.

The periodic table Group 13 metal nitride crystal of the invention is preferably manufactured using a vapor phase process such as (1) to (4) above. From the standpoint of mass productivity, the use of the HVPE or MOCVD is preferred, with the use of HVPE being especially preferred.

Although no particular limitation is imposed on the specific crystal growing conditions (in the crystal growing step), a periodic table Group 13 metal nitride crystal that satisfies the above-described essential features of the invention can be manufactured by the initial stage of crystal growth proceed by two-dimensional growth or step-flow growth.

Crystal growth modes for initial growth of the periodic table Group 13 metal nitride layer include the three-dimensional growth mode, the two-dimensional growth mode and the step-flow growth mode. It is apparent from studies done by the inventors that there is a possibility, in the three-dimensional growth mode, of island-like periodic table Group 13 metal nitride crystals growing as seed crystals on the underlying substrate and of island-like (three-dimensional) growth proceeding, resulting in the introduction of a large amount of faults when the islands coalesce. Hence, when growing the periodic table Group 13 metal nitride layer on the underlying substrate, particularly at the initial stage of growth, by employing growth conditions that increase the wettability of the starting materials with respect to the underlying substrate and by promoting a two-dimensional growth or step-flow growth mode, a high-quality periodic table Group 13 metal nitride crystal having a reduced number of stacking faults can be obtained even in cases where thick-film formation has been carried out. The specific period of initial growth (initial stage of crystal growth) is not particularly limited, and may represent, for example, a period of from 1 to 30 minutes from the start of crystal growth.

Other than the above-described method involving two-dimensional growth or step-flow growth, by utilizing lateral growth which entails having crystal growth proceed in a direction perpendicular to the direction of crystal growth (the direction of increasing crystal thickness for the crystal as a whole), it is possible to obtain a periodic table Group 13 metal nitride crystal which satisfies the essential features of the invention. Specifically, such a crystal can be obtained by removing, from a crystal grown in such a way that lateral growth also proceeds, regions that have formed on the principal plane of the underlying substrate and regions that have formed by lateral growth from sidewalls of the underlying substrate, and collecting the regions that have formed on top of the regions formed by lateral growth from sidewalls of the underlying substrate. That is, the crystal that has formed on a region formed by lateral growth can become a periodic table Group 13 metal nitride crystal which satisfies the essential features of the invention. Lateral growth can be controlled by means of parameters such as temperature, source gas partial pressure, nitrogen source/periodic table Group 13 metal source ratio, and source gas feed port-crystal growth end distance. However, in the case of lateral growth, the gas addition time at the initial stage of growth is generally at least 10 seconds, preferably at least 20 seconds, and more preferably at least 30 seconds, and is generally not more than 10 minutes, preferably not more than 5 minutes, and more preferably not more than 2 minutes.

The manufacturing method for obtaining the periodic table Group 13 metal nitride crystal of the invention is preferably a method that carries out two-dimensional growth or step-flow growth, that is, a method (referred to below as Manufacturing Method 1") which includes the step of growing, by a vapor phase process, a periodic table Group 13 metal nitride layer on a periodic table Group 13 metal nitride underlying substrate having a non-polar or semi-polar plane as the principal plane, wherein, at the initial stage of the growth step, the periodic table Group 13 metal nitride layer is two-dimensionally grown or step-flow grown.

The growth step may be one in which growth occurs also on planes other than the principal plate of the underlying substrate. Moreover, the growth step, providing it is growth on the principal plane of the base substrate, need not necessarily involve growth in a direction perpendicular to the principal plane. Also, the direction of growth may change in the course of the growth step.

The thickness of the crystal grown on the principal plane of the base substrate may be suitably selected according to, for example, the size of the Group 13 metal nitride crystals in the periodic table that one ultimately wishes to obtain. With such a production method, the formation and expansion of stacking faults can be suppressed, enabling the thickness of the crystal grown on the principal plane of the underlying substrate to be made, for example, 1 mm or more, preferably 3 mm or more, and more preferably 10 mm or more. The crystal thickness is preferably not more than 51 mm, more preferably not more than 24 mm, and even more preferably not more than 14 mm. As used herein, "thickness" refers to the thickness in the direction perpendicular to the principal plane of the underlying substrate.

Two-dimensional growth or step-flow growth in the initial stage of crystal growth can be achieved by selecting conditions such as (a) to (d) below.
(a) Using an underlying substrate in which the principal plane is the (10-10) plane or a plane tilted at least 1.5° in the [0001] or [000-1] direction from the (10-10) plane.
(b) Growing the crystal in an atmosphere in which at least 40 volt of the total gas flow rate is inert gases.
(c) Growing the crystal at a growth temperature not higher than 1040° C.
(d) When introducing gases into the system at the start of growth, setting the time required until the predetermined gas flow rate is achieved (referred to below as "gas introduction time") to not more than 10 minutes.

These conditions may be used alone or may be used in combination. Of these, employing a combination of (a) and (b) is preferred. It is also preferable to combine (c) and (d) with these.

Up until now, in cases where the growth of a periodic table Group 13 metal nitride crystal was carried out by HVPE using an underlying substrate having a polar plane as the principal plane, when an inert gas such as nitrogen was used as the carrier gas, a large amount of polycrystal adhered to the interior of the reactor, causing reactor deterioration or adversely affecting the crystallinity. Hence, hydrogen or the like has generally been used as the carrier gas. However, it has become apparent from investigations by the inventors that, surprisingly, when use is made of an underlying substrate in which a planar orientation other than a polar plane is the principal plane, the formation and propagation of stacking faults can be suppressed by carrying out crystal growth in an atmosphere in which at least 40 vol % of the total gas flow rate is inert gases. In addition, when the (10-10) plane serves as the principal plane of the underlying substrate, by imparting to this a specific misorientation angle, not only can the number of stacking faults within the resulting crystal be reduced, it is possible as well to effectively suppress the formation of polycrystal that has hitherto been a problem.

The above conditions (a) to (d) are described below in greater detail.
(a) Using an underlying substrate in which the principal plane is the (10-10) plane or a plane tilted at least 1.5° in the [0001] or [000-1] direction from the (10-10) plane.

In this invention, the principal plane of the underlying substrate is a non-polar plane or a semi-polar plane. However, in order to have two-dimensional growth or step-flow growth proceed more easily, an underlying substrate in which the principal plane is a plane tilted at least 1.5° in the [0001] or [000-1] direction from the (10-10) plane, a non-polar plane, is preferred. The angle of tilt from the (10-10) plane is sometimes referred to as the misorientation angle. The misorientation angle of the underlying substrate is preferably at least 1.5°, more preferably at least 1.75°, and even more preferably at least 2.0°, but is preferably not more than 30°, more preferably not more than 15°, and even more preferably not more than 10°. The direction of tilt from the (10-10) plane is preferably [000-1]. Preferred planar orientations for the principal plane are {20-21} planes, {20-2-1} planes, {30-31} planes, {30-3-1} planes, {10-11} planes, {10-1-1} planes, {10-12} planes, {10-1-2} planes, {11-22} planes, {11-2-2} planes, {11-21} planes and {11-2-1} planes.
(b) Growing the crystal in an atmosphere in which at least 40 vol % of the total gas flow rate is inert gases.

In the growth step, growing the periodic table Group 13 metal nitride layer in an atmosphere in which at least 40 vol % of the total gas flow rate is inert gases makes it easier for two-dimensional growth or step-flow growth at the initial stage of the growth step to proceed, enabling the formation and expansion or propagation of stacking faults to be suppressed. Setting the proportion of inert gases included in the total gas flow rate to at least 70 vol % is preferred, and setting this to at least 90 vol % is more preferred. The proportion of inert gas included in the total gas flow rate can be calculated from the sum of the flow rates of all the inert gases that have been passed through the reactor relative to the sum of the flow rates of all the gases that have been passed through the reactor.
(c) Growing the crystal at a growth temperature not higher than 1040° C.

Having the growth temperature in the growth step be a relatively low temperature makes it easier for the two-dimensional growth or step-flow growth to proceed at the initial stage of the growth step, and enables the formation and expansion or propagation of stacking faults to be suppressed. In particular, it suffices for the growth temperature at the initial stage of the growth step to be a low temperature, and is acceptable to raise the temperature in the course of the growth step. Specifically, the temperature thereof is preferably 1040° C. or less, more preferably 1000° C. or less, even more preferably 980° C. or less.
(d) When introducing gas at the start of growth, setting the time required until the predetermined gas flow rate is achieved (referred to below as "gas introduction time") to not more than 10 minutes.

When gas is introduced at the start of growth, by having the time required until the predetermined gas flow rate is achieved be a relatively short time, it is possible to carry out the desired growth from the start of growth, enabling the formation and expansion or propagation of stacking faults to be suppressed. The time thereof is preferably 10 minutes or less, more preferably 5 minutes or less, even more preferably 2 minutes or less.

The method of manufacture for obtaining the periodic table Group 13 metal nitride crystal of the invention is most preferably a manufacturing method which combines above conditions (a) and (b); that is, a manufacturing method that includes the step of growing a periodic table Group 13 metal nitride layer by a vapor phase process on a periodic table Group 13 metal nitride underlying substrate having as the principal plane a plane tilted at least 1.5° in the [0001] or [000-1] direction from the (10-10) plane, and a manufacturing method which, in the crystal growing step, grows a periodic table Group 13 metal nitride layer in an atmosphere in which at least 40 vol % of the total gas flow rate is inert gases (referred to below as "Manufacturing Method 2").

Hereafter in this specification, the phrase "manufacturing method of the invention" shall be understood to include above Manufacturing Method 1 and Manufacturing Method 2, and to collectively refer to both.

For the sake of illustration, a crystal growing method which uses HVPE is described below together with the manufacturing apparatus, but it shall be understood that the crystal growing step in the inventive manufacturing method is not limited to this example, and the use of the other crystal growing methods mentioned above is also possible.

<Production Equipment and Production Conditions>

1) Basic Structure

FIG. 1 is a schematic diagram of a manufacturing apparatus which may be employed in a manufacturing method that uses HVPE. The HVPE equipment illustrated in FIG. 1 includes, within a reactor 100: a susceptor 107 for loading a base substrate (seed), and a reservoir 105 which is charged with a starting material for the Group 13 metal nitride crystals in the periodic table to be grown. The apparatus is provided with introduction tubes 101 to 104 for introducing a gas into the reactor 100 and an exhaust tube 108 for exhaustion. The apparatus is further provided with a heater 106 for heating the reactor 100 from a side.

2) Reactor Material, and Types of Atmospheric Gases

Quartz, sintered born nitride, stainless steel and the like are used as a material of the reactor 100. Preferred material is quartz. Atmosphere gas is charged in the reactor 100 in advance of initiation of the reaction. The atmosphere gas (carrier gas) can include a gas such as hydrogen, nitrogen, He, Ne or Ar.

Of these, to manufacture high-quality periodic table Group 13 metal nitride crystal having a low stacking fault density, using an inert gas such as nitrogen, helium, neon or argon as the ambient gas is preferred, with the use of nitrogen ($N_2$) being more preferred. Those gases may be used singly or as mixtures thereof. When an inert gas is used as the ambient gas, the content of inert gas in the ambient gas is preferably at least 40 vol %, more preferably at least 70 volt, and even more preferably at least 90 volt.

Setting the ambient gas within the above range is desirable because the proportion of inert gas included in the total gas flow rate can be easily controlled, and preparing an atmosphere containing inert gas that accounts for at least 40 volt of the total gas flow rate is easy.

By setting the proportion of inert gas in the total gas flow rate to at least 40 volt, in crystal growth on the principal plane of the underlying substrate, decomposition of the underlying substrate surface during growth (initial stage of growth) and of the crystal growth surface (during thick-film growth) is reduced and feedstock wettability of the underlying substrate surface increases, making it possible to achieve two-dimensional growth that is capable of high-quality crystal growth. Stacking faults typically expand as the grown film thickness increases, but if two-dimensional growth or step-flow growth is carried out at the initial stage of the growth step, stacking faults do not readily expand in the periodic table Group 13 metal nitride layer that is grown, making it easy to maintain a high-quality state even at a larger film thickness.

The proportion of inert gas may remain fixed during growth or may be varied during growth, so long as it remains within the above range. The period of time to change the content of the inert gases is preferably 1 second or longer, more preferably 1 minute or longer and further preferably 1 hour or longer. Such changes may entail changing all the types of gas at the same time, or changing each type of gas in succession. Also, in the course of growth, the types of gas may be kept the same without changing, or may be changed. For example, in one conceivable case, $N_2$ is used as the inert gas at the initial stage of growth, and argon is used as the inert gas during the main stage of growth.

With a rise in the proportion of inert gas in the total gas flow rate, changes occur in the gas flow at the reactor interior. When the balance in gas flow from the respective inlets breaks down, a large amount of polycrystal adheres to the nozzle interior, leading to the problem of reactor deterioration during cooling. Hence, a search was done for gas conditions that avoid the formation of polycrystal at the interior of inlets when the periodic table Group 13 source and the nitrogen source are supplied as gases, whereupon it was found to be desirable for the ratio of the density of a periodic table Group 13 source-containing gas (referred to below as "periodic table Group 13 source gas") to the density of a nitrogen source-containing gas (referred to below as "nitrogen source gas"), which ratio is expressed as (periodic table Group 13 source gas density/nitrogen source gas density), to fall within a specific range. The periodic table Group 13 source gas density/nitrogen source gas density ratio is preferably less than 1, and more preferably 0.8 or less. In this range, natural convection does not readily arise between the inlet openings and the susceptor and the underlying substrate surface, enabling the formation of polycrystal within the inlets to be suppressed, which is desirable. Here, the periodic table Group 13 source gas and the nitrogen source gas are each presumed to be mixed gases of the source gas with carrier gas. The density of the mixed gas can be calculated from the densities of the respective individual gases and the mixing ratio. The density can be calculated using, for example, formula (1) below.

$$DT = \Sigma(D_n L_n)/\Sigma L_n \quad (1)$$

where

DT: Density of mixed gas

Dn: Individual densities of respective gases

Ln: Feed rates of respective gases

3) Susceptor Material and Shape, and Distance of Susceptor from Growth Face

The material making up the susceptor 107 is preferably carbon, and it is more preferable for the surface to be coated with SiC. The shape of the susceptor 107 is not particularly limited, provided it is a shape that enables the base substrate used in the present invention to be placed thereon. However, it is preferable for there to be no structure present near the crystal growth face during crystal growth. Where a structure having a possibility to grow is present in the vicinity of a crystal grow face, a polycrystal is adhered thereto, and HCl gas is generated as its product, and adversely affects a crystal to be grown. Contact face between the seed crystal 109 and the susceptor 107 separates from the principal plane (crystal growth face) of the seed crystal with a distance of preferably 1 mm or more, more preferably 3 mm or more and further preferably 5 mm or more.

4) Reservoir

The starting material for the periodic table Group 13 metal nitride semiconductor to be grown is charged into the reservoir 105. Specifically, a starting material that may become a periodic table Group 13 source is charged. Examples of such materials that may become a periodic table Group 13 source include gallium (Ga), aluminum (Al) and indium (In). A gas that reacts with the starting material charged into the reservoir 105 is fed in through an inlet 103 for introducing gas into the reservoir 105. For example, when a starting material serving as the periodic table Group 13 source has been charged into the reservoir 105, HCl gas may be supplied via the inlet 103. At this time, a carrier gas may be supplied via the inlet 103 together with the HCl gas. The carrier gas can include a gas such as hydrogen, nitrogen, He, Ne or Ar, and nitrogen is preferably used to produce a crystal which satisfies $Qx_{1/300}$ of the present invention. Those gases may be used singly or as mixtures thereof.

5) Nitrogen Source (Ammonia), Separation Gas, Dopant Gas

A source gas becoming a nitrogen source is fed from an introduction tube 104. $NH_3$ is generally fed. A carrier gas is fed from an introduction tube 101 and an introduction tube 102. The carrier gas can be exemplified by the same gases as the carrier gases fed from the introduction tube 103. The carrier gas has the effect of suppressing reaction between source gases in the vapor phase and preventing adhesion of a polycrystal to the tip of the nozzles. A dopant gas can be fed from the introduction tube 102. For example, an n-type dopant gas such as $SiH_4$, $SiH_2Cl_2$ or $H_2S$ can be fed.

6) Method of Introducing the Gases

The gases fed from the introduction tubes 101 to 104 may be fed from different introduction tubes from those described above by exchanging the respective gases with each other. The source gas becoming a nitrogen source, and the carrier gas may be mixed and fed from the same introduction tube. Furthermore, the carrier gas may be mixed from another introduction tube. Those feed embodiments can appropriately be determined depending on the size and shape of the reactor 100, reactivity of raw materials, the desired crystal growth rate, and the like.

7) Placement of Exhaust Tube

A gas exhaust tube 108 can be provided at the top, the bottom and the side of an inner wall of the reactor. The gas exhaust tube 108 is preferably provided at a position lower than the crystal growth end from the standpoint of dust drop, and is more preferably provided at the bottom of the reaction as shown in FIG. 1.

8) Crystal Growing Conditions

Crystal growth in the manufacturing method of the invention is generally carried out at 800° C. to 1200° C., preferably at 900° C. to 1100° C., and more preferably at 950° C. to 1050° C. Exemplary conditions for producing crystals which satisfy $Qx_{1/300}$ in this invention include in particular suppressing island growth and enhancing feedstock wettability at the surface of the underlying substrate so as to promote two-dimensional growth. From this standpoint, at the initial stage of crystal growth (0 to 15 minutes) and/or during the main stage of crystal growth, it is desirable for the growth temperature to be set to a relatively low temperature of preferably from 900° C. to 1000° C., and more preferably from 920° C. to 980° C.

The crystal growth time is not particularly limited, and is generally from 10 hours to 100 hours. The growth time may be suitably varied according to the target thickness to which the film is to be grown. Pressure in the reactor is preferably from 10 kPa to 200 kPa, more preferably from 30 kPa to 150 kPa and further preferably from 50 kPa to 120 kPa.

When introducing gases into the system at the start of crystal growth, setting the time required until each gas reaches the predetermined gas partial pressure (gas flow rate), which time is referred to below as the "gas introduction time," to a relatively short time influences the surface morphology and growth regime of the initial growth layer. This is desirable because, even in cases where the periodic table Group 13 metal nitride layer is subsequently rendered into a thick film, the occurrence of anisotropic strain between the growth direction and the growth plane is suppressed, enabling the expansion and propagation of stacking faults to be suppressed. The use of hydrogen gas-containing carrier gas in the growth step is particularly desirable because the above effects are easily obtained.

The partial pressure of gallium chloride (GaCl) is generally from $3 \times 10^1$ to $3 \times 10^4$ Pa, preferably from $4 \times 10^1$ to $2 \times 10^3$ Pa, and more preferably from $2 \times 10^2$ to $2 \times 10^3$ Pa. The partial pressure of ammonia ($NH_3$) is generally from $1 \times 10^3$ to $3 \times 10^5$ Pa, preferably from $2 \times 10^3$ to $2 \times 10^4$ Pa, and more preferably from $4 \times 10^3$ to $1 \times 10^4$ Pa.

Also, it is preferable to carry out treatment which increases the partial pressure of each type of gas for a predetermined period of time at the initial stage of crystal growth. Increasing the partial pressure of each type of gas at the initial stage of crystal growth exerts an influence on the surface morphology and growth regime of the initial growth layer, resulting in a tendency for the occurrence of crystal strain in subsequent bulk crystal formation to be suppressed and for the formation of stacking faults to be suppressed. In particular, such gas partial pressure increasing treatment can be advantageously used as a condition for producing the bulk crystal from which regions that form on top of regions formed by lateral growth are to be collected. Also, in cases where $H_2$ carrier gas is used as the carrier gas, the occurrence of stacking faults tends to be more effectively suppressed.

The amount of GaCl gas at the initial stage of crystal growth is generally at least $1.20 \times 10^2$ Pa, preferably at least $1.60 \times 10^2$ Pa, and more preferably at least $2.00 \times 10^2$ Pa. The amount of GaCl gas at the initial stage of crystal growth is generally not more than $9.00 \times 10^2$ Pa, preferably not more than $7.00 \times 10^2$ Pa, and more preferably not more than $5.00 \times 10^2$ Pa.

The amount of $H_2$ carrier gas at the initial stage of crystal growth is generally at least $1.00 \times 10^3$ Pa, preferably at least $5.00 \times 10^3$ Pa, and more preferably at least $1.00 \times 10^4$ Pa. The amount of $H_2$ carrier gas at the initial stage of crystal growth is generally not more than $7.00 \times 10^4$ Pa, preferably not more than $6.00 \times 10^4$ Pa, and more preferably not more than $5.00 \times 10^4$ Pa.

The amount of HCl gas at the initial stage of crystal growth is generally at least $1.80 \times 10^1$ Pa, preferably at least $3.00 \times 10^1$ Pa, and more preferably at least $4.00 \times 10^1$ Pa. The amount of HCl gas at the initial stage of crystal growth is generally not more than $2.00 \times 10^2$ Pa, preferably not more than $1.50 \times 10^2$ Pa, and more preferably not more than $1.00 \times 10^2$ Pa.

The introduction time of each of these gases is generally preferably 10 minutes or less, more preferably 5 minutes or less, even more preferably 2 minutes or less. Further, the gas introduction time is usually 10 seconds or more, preferably 20 seconds or more, and more preferably 30 seconds or more. By setting the gas introduction time in the above range, surface roughness of the underlying substrate at the initial stage of the growth step decreases and island growth can be effectively suppressed. Also, it is presumed that by reaching the desired gas conditions in a short time, the occurrence of stacking faults and dislocations can be suppressed.

The $H_2$ carrier gas partial pressure during temperature ramp-up up until reaching the crystal growth conditions is generally at least $1.00 \times 10^2$ Pa, preferably at least $3.00 \times 10^2$ Pa, and more preferably at least $5.00 \times 10^2$ Pa. The $H_2$ carrier gas partial pressure during temperature ramp-up until reaching the crystal growth conditions is generally not more than $5.00 \times 10^4$ Pa, preferably not more than $4.00 \times 10^4$ Pa, and more preferably not more than $3.00 \times 10^4$ Pa.

The $N_2$ carrier gas partial pressure during temperature ramp-up is generally not more than $9.00 \times 10^4$ Pa.

The $NH_3$ partial pressure during temperature ramp-up is generally at least $3.00 \times 10^3$ Pa, preferably at least $5.00 \times 10^3$ Pa, and more preferably at least $7.00 \times 10^3$ Pa. The $NH_3$ partial pressure during temperature ramp-up up until reaching the crystal growth conditions is generally not more than $6.00 \times 10^4$ Pa, preferably not more than $4.00 \times 10^4$ Pa, and more preferably not more than $2.00 \times 10^4$ Pa.

9) Crystal Growth Rate

The rate of crystal growth using the above-described production equipment varies depending on such factors as the growth process, the growth temperature, the feed rate of the source gases and the direction of the crystal growth face, but is generally in the range of from 5 µm/h to 500 µm/h, preferably 30 µm/h or more, more preferably 70 µm/h or more, and even more preferably 150 µm/h or more. The growth rate can be controlled by appropriately setting the kind and flow rate of carrier gas, the distance from feed opening to crystal growth end, and the like, in addition to those described above. For example, by making the flow rate of the gallium chloride (GaCl) serving as the periodic table Group 13 metal source and/or the flow rate of the ammonia ($NH_3$) serving as the nitrogen source larger and thus making the partial pressures of these gases higher, the growth rate can be increased.

Examples of Group 13 metal nitrides in the periodic table of the present invention include gallium nitride, aluminum nitride, indium nitride, and mixed crystals thereof.

The periodic table Group 13 metal nitride crystal of the invention has a carrier concentration in the crystal of preferably at least $1 \times 10^{18}$ cm$^{-3}$, and more preferably at least $1 \times 10^{19}$ cm$^{-3}$. When the carrier concentration in the crystal is high, the resistivity within the crystal is low, giving a semiconductor crystal having excellent electrical conductivity. The carrier concentration within the crystal can be determined by measuring the Hall coefficient using the van der Pauw method.

The Group 13 metal nitride crystals in the periodic table of the present invention can be used in various applications. In particular, the nitride crystal is useful as substrates of light emitting elements at relatively short wavelength side, such as ultraviolet, blue or green light emitting diodes and semiconductor lasers, and semiconductor devices such as electronic devices.

<Periodic Table Group 13 Metal Nitride Crystal Substrate>

1) Characteristics

A periodic table Group 13 metal nitride crystal substrate can be obtained by removing at least a portion of the underlying substrate from the periodic table Group 13 metal nitride crystal of the invention. The periodic table Group 13 metal nitride crystal substrate is characterized in that a non-polar plane or a semi-polar plane preferably serves as a principal plane, that warpage of the substrate in the direction of the line of intersection between a polar plane and the principal plane is smaller than warpage of the substrate in a direction orthogonal to this line of intersection, and that warpage of the substrate in a direction orthogonal to the line of the intersection is less than 1° per 40 mm. The direction of this line of intersection and the direction orthogonal thereto are both directions assumed to be within the plane of the substrate.

2) Thickness

The periodic table Group 13 metal nitride crystal substrate obtained from the periodic table Group 13 metal nitride crystal of the invention is preferably a self-supporting substrate. Specifically, the thickness is preferably 0.2 mm or more, more preferably 0.3 mm or more and even more preferably 0.4 mm or more. The substrate thickness and size can be adjusted within the desired ranges by the suitable regulation of polishing, cutting, etching and the like.

3) Principal Plane

The principal plane of the periodic table Group 13 metal nitride crystal substrate obtained from the periodic table Group 13 metal nitride crystal of the invention may be either a non-polar plane or a semi-polar plane, although it is preferably a low-index plane. For example, in a case where the base substrate is a hexagonal crystal whose principal plane is represented by (hklm), h, k, l and m are each independently any integer which is preferably from −3 to 3, and more preferably from −2 to 2. Illustrative examples of the principal plane of the periodic table Group 13 metal nitride crystal substrate include {20-21} planes, {20-2-1} planes, {30-31} planes, {30-3-1} planes, {10-11} planes, {10-1-1} planes, {10-12} planes, {10-1-2} planes, {11-22} planes, {11-2-2} planes, {11-21} planes, and {11-2-1} planes. Of these, {20-21} planes, {20-2-1} planes, {30-31} planes, {30-3-1} planes, {10-11} planes and {10-1-1} planes are preferred.

The warpage of the substrate in the direction orthogonal to the line of intersection of the periodic table Group 13 metal nitride crystal substrate obtained by the Group 13 metal nitride crystals in the periodic table of the present invention is preferably less than 1° per 40 mm, more preferably less than 0.80°, even more preferably less than 0.60°, and particularly preferably less than 0.40°. The substrate warpage in the direction of the line of intersection is preferably less than 0.85° per 40 mm, more preferably less than 0.65°, even more preferably less than 0.45°, and particularly preferably less than 0.25°. The difference between the substrate warpage per 40 mm in the direction orthogonal to the line of intersection and the substrate warpage per 40 mm in the direction of the line of intersection is generally from 0.02 to 1.0°, preferably from 0.03 to 0.75°, and more preferably from 0.05 to 0.5°.

For example, in cases where the principal plane of the periodic table Group 13 metal nitride crystal substrate is a {10-10} plane (i.e., an M plane) of a hexagonal crystal, the warpage in the direction of the line of intersection (i.e., the a-axis direction) between the {0001} plane which is a polar plane (i.e., a C plane) and the principal plane is smaller than the warpage in the direction orthogonal thereto (i.e., the c-axis direction). The c-axis direction warpage in this case is less than 1° per 40 mm. In another example, when the principal plane of a periodic table Group 13 metal nitride crystal substrate is the (11-20) plane (i.e., the A plane) of a hexagonal crystal, the warpage in the direction of the line of intersection (i.e., the m-axis direction) between the (0001)

plane which is a polar plane (i.e., a C plane) and the principal plane is smaller than the warpage in the direction orthogonal thereto (i.e., the c-axis direction). The c-axis direction warpage in this case is less than 1° per 40 mm.

The ratio (W1/W2) between the warpage of the substrate in the direction of the line of intersection between the polar plane and the principal plane (W1), and the warpage of the substrate in the direction orthogonal to the line of intersection (W2) is preferably less than 1, more preferably less than 0.8, and even more preferably less than 0.5. Further, the lower limit value is preferably 0.01 or more, more preferably 0.02 or more, and even more preferably 0.04 or more.

(4) Crystallinity of Substrate and Crystal Formed on Substrate

When a periodic table Group 13 metal nitride crystal is homoepitaxially grown on the principal plane of a periodic table Group 13 metal nitride crystal substrate obtained from the periodic table Group 13 metal nitride crystal of the invention, most of the stacking faults that form within the grown crystal are parallel to a polar plane. The stacking faults can be identified by observation in cathodoluminescence (CL) measurement of the crystal surface at a low temperature, as described below in the working examples.

For example, in a periodic table Group 13 metal nitride crystal substrate having the (10-10) plane (i.e., an M plane) as the principal plane, when a periodic table Group 13 metal nitride crystal is grown on the principal plane, it is primarily stacking faults parallel to the (0001) plane which is a polar plane (i.e., a C plane) that arise. Upon examination from the principal plane side in low-temperature CL measurement, stacking faults in the form of straight lines which extend in the a-axis direction are observed.

The periodic table Group 13 metal nitride crystal substrate obtained from the periodic table Group 13 metal nitride crystal of the invention and the crystal formed on this substrate contain few stacking faults, and thus exhibit good luminescence when used as semiconductor light-emitting devices such as LEDs. The degree of stacked faults is the same as for periodic table Group 13 metal nitride layer obtained by the above-described manufacturing method of the invention.

Threading dislocations are present in the principal plane of the periodic table Group 13 metal nitride crystal substrate and the crystal formed on this substrate. This is due to the fact that, because threading dislocations generally form in such a way as to extend in the growth direction of the crystal, threading dislocations are present in the growth plane of a crystal grown on an underlying substrate, as called for in the manufacturing method of the invention. The threading dislocations generally coincide with the dark points observed in CL measurement.

<Semiconductor Light-Emitting Device>

Semiconductor light-emitting devices can be fabricated using the periodic table Group 13 metal nitride crystal substrate obtained from the periodic table Group 13 metal nitride crystal of the invention. Generally, the semiconductor light-emitting device, such as an LED, is produced by growing Group 13 metal nitride crystals in the periodic table on the principal plane of the periodic table Group 13 metal nitride crystal substrate. Illustrative examples of the Group 13 metal nitride crystals in the periodic table that are grown include GaN, GaAlAs, AlInGaP, and InGaN. The crystal growth method is exemplified by, but not particularly limited to, metal organic chemical vapor deposition (MOCVD). By growing a crystal on a periodic table Group 13 metal nitride crystal substrate, the number of crystal defects is lower than when the crystal is grown on a conventional sapphire base substrate or on a periodic table Group 13 metal nitride crystal substrate having many stacking faults. Hence, high-power, durable semiconductor light-emitting devices can be provided.

EXAMPLES

The features of the present invention are illustrated more concretely below by way of working examples of the invention and comparative examples. The materials, usage amounts, ratios, treatment details, order of treatment and the like shown in the following examples can be suitably varied without departing from the gist of the invention. Therefore, the scope of the present invention should not limitedly be construed by the following specific examples.

Example 1: $N_2$ Carrier Growth

Crystal growth was carried out using the HVPE crystal manufacturing apparatus shown in FIG. 1. A single GaN self-supporting substrate 1 which was produced by (0001) plane growth, was of rectangular shape measuring 5 mm in the <0001> (c-axis) direction and 25 mm in the <11-20> (a-axis direction), and had a principal plane that was the (10-10) plane and was tilted 2° in the [000-1] direction was placed on a susceptor 107. The susceptor 107 with the substrate loaded thereon was placed in a reactor 100 as shown in FIG. 1. Next, the interior of the reactor was flushed with $N_2$ gas, following which the periodic table Group 13 source reservoir temperature was raised to 900° C. and the reaction chamber temperature was raised to 950° C. so that gas convection does not arise within the reactor in the above atmosphere, and a GaN single-crystal film was grown for 15 hours by HVPE. In this single-crystal growth step, the growth pressure was set to $1.01 \times 10^5$ Pa, the partial pressure of GaCl gas was set to $2.85 \times 10^2$ Pa, the partial pressure of $NH_3$ gas was set to $9.13 \times 10^3$ Pa, and the partial pressure of $N_2$ gas serving as a carrier gas was set to $9.19 \times 10^4$ Pa. Following completion of the single-crystal growth step, the temperature was lowered to room temperature and a GaN bulk crystal 1 was obtained. The crystal had an average grown film thickness of 1.1 mm in the [10-10] direction.

The resulting GaN bulk crystal 1 was shaped and subjected to surface polishing treatment, after which surface grinding was conducted thereto by the customary technique, then polishing was subsequently carried out, thereby producing a 330 μm thick free-standing rectangular GaN substrate 2 having a length of 4 mm in the direction of <0001> (c-axis) and a length of 20 mm in the direction of <11-20> (a-axis), in which the principal plane was (10-10) plane. The stacking fault density of the GaN crystal produced was determined by low-temperature photoluminescence (PL) measurement (LTPL measurement). A He—Cd laser having a center wavelength of 325 nm as the excitation light source was used at a measurement temperature of 10 K. The intensity ratio $I(BSF)/I(D^0X_A)$ of the 3.41 eV peak intensity from stacking faults (BSF) to the 3.47 eV peak intensity $I(D^0X_A)$ from band-edge luminescence had a good value of 0.0045.

X-rays were made to enter the (100) plane of the resulting GaN self-supporting substrate 2 in a direction perpendicular to the a-axis and reciprocal lattice mapping measurement of the (100) plane was carried out. In the Qx direction profile that includes a maximum intensity and is derived from an isointensity contour plot obtained by such mapping, the width at the foot of the peak (Qx width) was estimated.

Measurement was carried out with a high-resolution x-ray diffractometer (X'Pert Pro MRD, available from PANalytical B.V.).

The x-ray beam was generated using a line focus x-ray tube, with a divergence slit inserted before a Ge (220) asymmetrical two-reflection monochromator, using the CuKα1 line, with a pinhole collimator mounted in front of the monochromator, and such as to have the full width at half maximum (FWHM) of Gaussian function approximations at the surface of the GaN self-supporting substrate 2 be 100 μm in the horizontal direction and 400 μm in the vertical direction. The beam was parallel to the direction perpendicular to the ω axis of rotation, and the beam diameter in the horizontal direction orthogonal thereto was sufficiently narrowed to 100 μm, making it possible to eliminate the influence of crystal plane curvature (warpage) on the diffracted beam.

A one-dimensional semiconductor detector having a high angular resolution was used as the detector.

The incident direction of the x-ray beam was set by carrying out a so-called Phi scan in such a way that the diffraction intensity of the asymmetric (20-4) plane becomes a maximum, deciding on the sample direction, and having the incident direction be exactly perpendicular to the a-axis.

The sample was axially aligned in the (100) diffraction plane, after which a 2θ-ω two-axis scan was carried out in angular steps of 0.005° for both 2θ and ω over a measurement angle range of 1°. The resulting 2θ-ω two-dimensional intensity mapping data was converted to Qx-Qy coordinate system data, thereby giving reciprocal lattice map data. In a Qx direction profile that includes a maximum intensity and is derived from an isointensity contour plot obtained from this data, the width at the foot of the peak (Qx width) was estimated.

The Qx widths at 1/300th and 1/1000th of the peak intensity were respectively $1.77 \times 10^{-4}$ (rlu) and $2.55 \times 10^{-4}$ (rlu), which were very small values.

Next, the anisotropy of the x-ray rocking curve was measured.

As with reciprocal lattice mapping measurement, measurement here too was carried out using a high-resolution x-ray diffractometer (X'Pert Pro MRD, from PANalytical B.V.)

The x-ray beam was generated using a line focus x-ray tube, with a divergence slit inserted before a Ge (220) asymmetrical two-reflection monochromator, using the CuKα1 line, with a pinhole collimator mounted in front of the monochromator, and such as to have the full width at half maximum (FWHM) of Gaussian function approximations at the sample be 100 μm in the horizontal direction and 400 μm in the vertical direction. In this example, during rocking curve measurement (ω scan), a one-dimensional array-type semiconductor detector was used, although a commonly used proportional counting-type detector may be employed.

As in the reciprocal lattice mapping measurement described above, the x-ray beam was made to enter from a direction perpendicular to the a-axis, and the (100) rocking curve was measured with a one-dimensional array-type semiconductor detector in open detector mode. The full width at half maximum of the peak intensity and the spectral widths at 1/300th and 1/1000th of the peak intensity were respectively 25.5 arc-sec, 184 arc-sec and 335 arc-sec.

Next, the GaN self-supporting plate 2 was rotated 90°, the x-ray beam was made to enter from a direction perpendicular to the c-axis, and the rocking curve of the (100) plane (Open detector) was measured. The full width at half maximum of the peak intensity and the spectral widths at 1/300th and 1/1000th of the peak intensity were respectively 26.0 arc-sec, 164 arc-sec and 292 arc-sec.

The spectral widths of (100) XRC when the x-ray beam enters from a direction perpendicular to the a-axis were divided by the spectral widths of (100) XRC when the x-ray beam enters from a direction perpendicular to the c-axis, and the resulting ratios were calculated. These ratios for the full width at half maximum of the peak intensity and for the spectral widths at 1/300th and 1/1000th of the peak intensity were respectively 0.98, 1.12 and 1.15, indicating that the anisotropy was small. By thus adopting the spectral width ratios as indicators of the crystal characteristics, it is possible to extract data that is not easily influenced by the optical system used during x-ray diffraction measurement.

The misorientation angle distribution in the c-axis direction of the GaN self-supporting substrate 2 was found to be, for a distance of 40 mm, ±0.12°, which is a very small value. The measurement range was set to 15 mm and the measurement interval was set to 1 mm.

Also, an undoped GaN layer was grown to 1 μm by MOCVD on a GaN self-supporting substrate 2, and the stacking fault density was evaluated by cathodoluminescence (CL) measurement.

Using a SEM-CL system, cathodoluminescence (CL) image at about 100 K was examined in substantially the same region as the place where x-ray diffraction measurement of the GaN self-supporting substrate 2 was carried out, and the basal plane stacking fault (BSF) density was measured. The electron beam used in scanning electron microscopy had an acceleration voltage of 5 kV. Aside from the residual donor-bound exciton emission peak (approx. 356 nm) from spectrum measurement, a weak emission peak from BSF (approx. 364 nm) was observed. The spectrometer was set to 364 nm, and the spatial distribution of BSFs was observed. BSFs extending in a direction perpendicular to the c-axis of the sample were seen; the average length of a-axis direction BSFs observed on the m-plane surface was 33 μm. To estimate the stacking fault density per unit length, the number of BSFs within the field of view of the CL image observed was determined at a sampling interval (20 μm) shorter than the average length of the BSFs observed at the surface, and the average value was calculated, giving a very small value of 6×10/cm.

Example 2: N₂ Carrier Growth

Crystal growth was carried out using the HVPE crystal manufacturing apparatus shown in FIG. 1. A GaN self-supporting substrate which was manufactured by (0001) plane growth, was of rectangular shape measuring 5 mm in the <0001> (c-axis) direction and 25 mm in the <11-20> (a-axis direction), and had a principal plane tilted 1° in the [000-1] direction from the (10-10) plane was placed as the underlying substrate on a susceptor 107. The susceptor 107 on which the underlying substrate had been placed was situated as shown in FIG. 1 in the reactor 100. Next, the reactor interior was flushed with N₂ gas, following which, in this atmosphere, the temperature of the periodic table Group 13 source reservoir 106 was raised to 900° C., the reaction chamber temperature was raised to 950° C., and a GaN single-crystal layer was grown for 15 hours by HVPE. In this single-crystal growth step, the growth pressure was set to $1.01 \times 10^5$ Pa, the partial pressure of GaCl gas was set to $2.85 \times 10^2$ Pa, the partial pressure of NH₃ gas was set to $9.13 \times 10^3$ Pa, and the percentage of inert gas (N₂) in the total gas flow rate was set to 91 volume %. The periodic table Group 13 source gas density/nitrogen source gas density at this time was set to 1.09, and the gas introduction time was set at 1 minute.

Following completion of the single-crystal growth step, the temperature was lowered to room temperature and a GaN bulk crystal was obtained. The crystal grown on the underlying substrate had an average grown film thickness of about 1 mm in the [10-10] direction. Some polycrystal was attached to the inlets. The results are shown in Table 1.

Examples 3 to 7

In each of these examples, aside from changing the misorientation angle of the principal plane in the [000-1] direction and the growth temperature to the conditions indicated in Table 1, a GaN bulk crystal was obtained in the same way as in Example 2. The crystal grown on the underlying substrate had an average film thickness in the [10-10] direction of about 1 mm. The results are presented in Table 1.

Reference Example

Figure 3A:
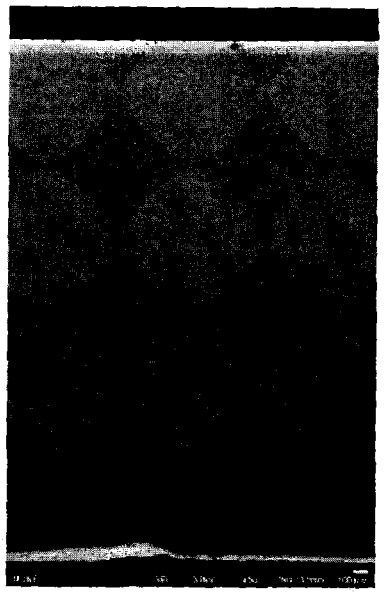
FIGS. 3A and 3B show scanning electron micrographs of the surfaces of samples produced in the reference working example (FIG. 3A) and the reference comparative example (FIG. 3B) (photographs provided in place of diagram).

Growth of a periodic table Group 13 nitride layer was carried out for just 1 minute under the same conditions as in Example 2, and the surface of the periodic table Group 13 nitride layer obtained by completing growth after 1 minute was examined with a scanning electron microscope. The results are shown in FIG. 3A. At the surface of this sample, a periodic table Group 13 nitride layer had formed uniformly over the entire surface of the underlying substrate, and it was apparent that two-dimensional growth had occurred. This implied that, in the above-described working examples as well, the mode of growth at the initial stage of the growth step was two-dimensional growth.

Comparative Example 1

Crystal growth was carried out using the HVPE crystal manufacturing apparatus shown in FIG. 1. A GaN self-supporting substrate which was manufactured by (0001)

TABLE 1

| | | Example 2 | Example 3 | Example 4 | Example 5 | Example 6 | Example 7 |
|---|---|---|---|---|---|---|---|
| Underlying substrate | Underlying substrate | GaN | GaN | GaN | GaN | GaN | GaN |
| | Orientation of principal plane | (10-10) | (10-10) | (10-10) | (10-10) | (10-10) | (10-10) |
| | Misorientation angle of principal Plane in -c-axis direction (°) | 1 | 2 | 3 | 5 | 1 | 2 |
| GaN layer | Growth temperature (° C.) | 950 | 950 | 950 | 950 | 1000 | 1000 |
| | Growth rate (μm/hr) | 76 | 75 | 75 | 77 | 69 | 68 |
| | LTPL intensity ratio (I(BSF)/I($D^0X_A$)) | 0.08 | 0.03 | 0.04 | 0.08 | 0.11 | 0.04 |
| | Presence/absence of cracks | No cracks | No cracks | No cracks | No cracks | No cracks | No cracks |

The stacking fault densities of the GaN bulk crystals obtained were evaluated by low-temperature photoluminescence measurement (LTPL measurement). A He—Cd laser having a center wavelength of 325 nm as the excitation light source was used at a measurement temperature of 10 K. The ratios of the peak intensity I(BSF) at 3.41 eV from stacking faults to the peak intensity I($D^0X_A$) at 3.47 eV from band-edge luminescence (which ratios are referred to here as I(BSF)/I($D^0X_A$)) in samples grown at a growth temperature of 950° C. and using an underlying substrate in which the principal plane had a misorientation angle in the [000-1] direction of 2° or 3°, were 0.03 and 0.04, which are small values. These results suggest that the stacking fault density is small.

Furthermore, the sample of Example 3 was shaped and subjected to surface polishing treatment, after which surface grinding was conducted thereto by the customary technique, then polishing was subsequently carried out, thereby producing a 330 μm thick free-standing rectangular GaN substrate having a length of 4 mm in the direction of <0001> (c-axis) and a length of 20 mm in the direction of <11-20> (a-axis), in which the principal plane was (10-10) plane. An undoped GaN layer was grown to 1 μm on this substrate using a MOVPE system, and the stacking fault density was determined by low-temperature cathodoluminescence (LTCL) observation at 4 kV and 500 pA in a 200× field of view. In the LTCL image, the horizontal lines present in directions parallel to the C plane are stacking faults. The stacking fault density was calculated in this way, giving a good value of 5.28×10² cm⁻¹. These results confirmed the advantage of using N₂ as the carrier gas and using as the substrate an underlying substrate with a principal plane having a misorientation angle in the [000-1] direction of 2°.

plane growth, was of rectangular shape measuring 5 mm in the <0001> (c-axis) direction and 25 mm in the <11-20> (a-axis direction), and had a principal plane that was tilted 1° in the [000-1] direction from the (10-10) plane was placed on a susceptor 107. The susceptor 107 with the substrate loaded thereon was placed in a reactor 100 as shown in FIG. 1. Next, the reactor interior was flushed with N₂ gas, following which the periodic table Group 13 source reservoir temperature 106 was raised to 900° C. and the reaction chamber temperature was raised to the growth temperature of 1040° C. in the above atmosphere, and a GaN single-crystal layer was grown for 15 hours by HVPE. In this single-crystal growth step, the growth pressure was set to 1.01×10⁵ Pa, the partial pressure of GaCl gas was set to 3.26×10² Pa, the partial pressure of NH₃ gas was set to 1.04×10⁴ Pa, and the percentage of inert gas (N₂) in the total gas flow rate was set to 12 volume %. The periodic table Group 13 source gas density/nitrogen source gas density ratio at this time was set to 0.83, and the gas introduction time was set to 1 minute.

Following completion of the single-crystal growth step, the temperature was lowered to room temperature and a GaN bulk crystal was obtained. The crystal grown on the underlying substrate had an average film thickness of about 1 mm in the [10-10] direction. Moreover, no polycrystal adhesion whatsoever was found in the inlets.

The stacking fault density of the GaN bulk crystal obtained was evaluated by low-temperature photoluminescence measurement (LTPL measurement). A He—Cd laser having a center wavelength of 325 nm as the excitation light source was used at a measurement temperature of 10 K. The intensity ratio I(BSF)/I($D^0X_A$) of the peak intensity I(BSF) at 3.41 eV from stacking faults to the peak intensity I($D^0X_A$) at 3.47 eV from band-edge luminescence was 0.63. Compared with the results from Examples 2 to 7, the stacking fault density at places having a grown film thickness of about 1 mm was poor.

Reference Comparative Example

Figure 3B:
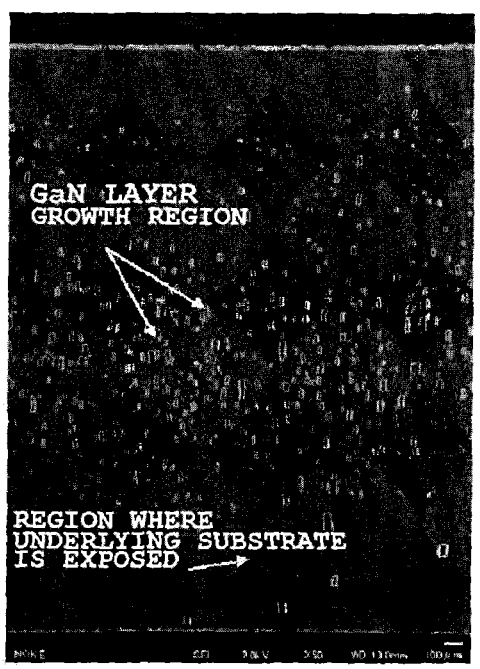

Growth of a periodic table Group 13 nitride layer was carried out for just 1 minute under the same conditions as in Comparative Example 1, and the surface of the periodic table Group 13 nitride layer obtained by completing growth after 1 minute was examined with a scanning electron microscope. The results are shown in FIG. 3B. At the surface of this sample, a periodic table Group 13 nitride layer formed as islands and many regions were seen where the underlying substrate is exposed. It was apparent that growth of the periodic table Group 13 nitride layer was non-uniform and that two-dimensional growth had not occurred. This implied that, in the above Comparative Example 1 as well, the mode of growth at the initial stage of the growth step was three-dimensional growth rather than two-dimensional growth.

Example 8

Crystal growth was carried out using a HVPE crystal manufacturing apparatus. A total of 22 GaN self-supporting substrates were manufactured by (0001) plane growth. Each was of a rectangular shape measuring 5 mm in the <0001> (c-axis) direction and 30 mm in the <11-20> (a-axis direction), and had a principal plane that was tilted 2° in the [000-1] direction from the (10-10) plane. The 22 substrates were arranged in two rows in the <0001> (c-axis) direction and 11 rows in the <11-20> (a-axis) direction, and placed on a susceptor. The susceptor on which the arranged substrates had been mounted was placed in the reactor, the temperature of the periodic table Group 13 source reservoir 106 was raised to 900° C. and the temperature of the reaction chamber was raised to the growth temperature of 950° C., and a GaN single-crystal layer was grown by HVPE for 53 hours. In this single-crystal growth step, the growth pressure was set to $1.01 \times 10^5$ Pa, the partial pressure of GaCl gas was set to $3.54 \times 10^2$ Pa, the partial pressure of NH3 gas was set to $1.13 \times 10^4$ Pa, and the percentage of inert gas ($N_2$) in the total gas flow rate was set to 49 volume %. The periodic table Group 13 source gas density/nitrogen source gas density ratio at this time was 0.72, and the gas introduction time was 1 minute.

Following completion of the single-crystal growth step, the temperature was lowered to room temperature and a GaN bulk crystal was obtained. The crystal had an average film thickness of 2.2 mm in the [10-10] direction. Moreover, no polycrystal adhesion whatsoever was found in the inlets.

The dislocation density of the resulting GaN bulk crystal was evaluated in the as-grown state by cathodoluminescence (CL) microscopy at 3 kV, 500 pA and in a 500× field of view. In CL microscopy, the number of threading dislocations within the crystal was computed from the dark point density, giving a good value of $9.0 \times 10^5$ $cm^{-2}$.

Evaluation of a stacking fault was conducted by carrying out low-temperature photoluminescence (PL) measurement (LTPL measurement) by using a He—Cd laser having a center wavelength of 325 nm as the excitation light source at a measurement temperature of 10 K. The intensity ratio $I(BSF)/I(D^0X_A)$ of the peak intensity I(BSF) at 3.41 eV from stacking faults to the peak intensity $I(D^0X_A)$ at 3.47 eV from band-edge luminescence was 0.09 in this sample, which is much smaller than the value of 1.1 for the sample in Comparative Example 1 that was growth at an inert gas ratio of 12 vol %, suggesting that the stacking fault density was low. From the above results, it was confirmed to be advantageous to include in the overall gas flow rate at least 40 vol % of the inert gas $N_2$.

The resulting GaN bulk crystal was shaped and subjected to surface polishing treatment, after which it was sliced by the customary technique, then polishing was subsequently carried out, thereby producing two 330 μm thick free-standing circular GaN substrates with the diameter of 50 mm, in which the principal plane was (10-10) plane. The rocking curve (Open detector) for the (100) plane when x-rays entered the GaN self-supporting substrate thus obtained from a direction perpendicular to the a-axis was measured at 5 points in the plane. The spectral widths at one half of the peak intensity (FWHM) were very good values of, respectively, 28 to 37 arc-sec and 23 to 45 arc-sec.

The samples were rotated 90° and the rocking curve (Open detector) for the (100) plane when x-rays entered from a direction perpendicular to the c-axis was measured at 5 points in the plane. The spectral widths at one half of the peak intensity (FWHM) were very good values of, respectively 24 to 51 arc-sec and 24 to 70 arc-sec.

Example 9: Crystal Growth Using Seed Crystal in which Substrate Sidewall is Semi-Polar Plane (Production of Seed Crystal)

Crystal growth was carried out using the HVPE crystal manufacturing apparatus shown in FIG. 1. A total of 33 GaN self-supporting substrates 1' were manufactured by (0001) plane growth. Each was of a rectangular shape measuring 5 mm in the <0001> (c-axis) direction and 25 mm in the <11-20> (a-axis direction), and had a principal plane that was the (10-10) plane. The 33 substrates were arranged in three rows in the <0001> (c-axis) direction and 11 rows in the <11-20> (a-axis) direction, and placed on a susceptor 107. The susceptor 107 with the arranged substrates loaded thereon was placed in a reactor 100 as shown in FIG. 1, the temperature of the reaction chamber was raised to 1000° C., and a GaN single-crystal film was grown for 40 hours by the HVPE process. In this single-crystal growth step, the growth pressure was set to $1.01 \times 10^5$ Pa, the partial pressure of GaCl gas was set to $3.70 \times 10^2$ Pa, the partial pressure of $NH_3$ gas was set to $1.69 \times 10^3$ Pa, the partial pressure of $H_2$ carrier gas G1 was set to $6.00 \times 10^2$ Pa, and the partial pressure of $N_2$ carrier gas was set to $8.29 \times 10^3$ Pa. Following completion of the single-crystal growth step, the temperature was lowered to room temperature and a GaN bulk crystal 1' was obtained. The crystal had an average grown film thickness of 2.8 mm in the [10-10] direction. The resulting GaN bulk crystal 1' was shaped and subjected to surface polishing treatment, after which it was sliced by the customary technique, then polishing was subsequently carried out, thereby producing a 330 μm thick free-standing circular GaN substrate 2' with the diameter of 50 mm, in which the principal plane was (10-10) plane.

Dicing from the GaN self-supporting substrates 2' produced as described above was carried out in such a way that a portion of the sidewall formed at the (11-24) plane (which coincides with the plane that forms an angle of 39° with the (0001) plane). In this way, rectangular crystals measuring 3 mm in the <11-24> direction and 35 mm in the <11-20> (a-axis) direction and whose principal plane is the (10-10) plane were produced. Polishing was then carried out, producing rectangular GaN self-supporting substrates 3' having a thickness of 330 μm. By placing each end of the GaN self-supporting substrates 3' on 1 cm square PG plates lying on a susceptor 107, the GaN self-supporting substrates 3' were arranged so as to create a gap between the center of the substrate and the susceptor 107. A GaN single-crystal film was grown by HVPE for 40 hours.

In a mixed gas atmosphere in which the partial pressure of the $H_2$ carrier gas was $6.00\times10^2$ Pa, the partial pressure of the $N_2$ carrier gas was $8.29\times10^3$ Pa and the partial pressure of the $NH_3$ gas was $1.13\times10^4$ Pa, the temperature of the reaction chamber was raised to 1040° C. and held for 1 minute.

Growth of the GaN single-crystal film by HVPE was begun as described below.

After holding the temperature for 1 minute as mentioned above, the partial pressure of the GaCl gas was increased from 0 Pa to $3.54\times10^2$ Pa and the partial pressure of HCl gas was increased from 0 Pa to $6.00\times10^1$ Pa for 1 minute. The partial pressure of the $H_2$ carrier gas, after being held for 1 minute as mentioned above, was increased from $6.00\times10^2$ Pa to $4.00\times10^4$ Pa over 1 minute. In the subsequent single-crystal growth step, the growth pressure to the end of growth was set to $1.01\times10^5$ Pa, the partial pressure of the GaCl gas was set to $3.54\times10^2$ Pa, and the partial pressure of the $NH_3$ gas was set to $1.13\times10^4$ Pa. Following completion of the single-crystal growth step, the temperature was lowered to room temperature and a GaN crystal was obtained.

No abnormal growth was observed in the resulting GaN single crystals, which were crack-free. The growth thickness was about 4.3 mm in the m-axis direction (for the top and back faces combined) and about 7.0 mm in the [11-24] direction, Hence, in spite of the fact that the growth conditions were the same, differences in the growth rate depending on the planar orientation were confirmed. The growth rate in the [11-24] direction was 175 μm/hr, and was thus confirmed to be at least 1.5 times faster than the growth rate in the principal plane direction.

In a wing growth region (a region that forms on top of lateral growth) of the resulting GaN crystal, an approximately 1.2 mm thick growth portion (a portion having a thickness of about 1.2 mm, in the direction in which the thickness of the overall crystal increases, from a boundary plane between a region formed by lateral growth from the sidewall of the seed crystal and a region formed on top of lateral growth) was sliced in a principal plane having a misorientation angle of 5° in the <000-1> direction from the (10-10) plane. The GaN crystal was further polished using a diamond abrasive and surface polished by chemical mechanical polishing (CMP), thereby producing a 400 μm thick free-standing GaN substrate 4' whose principal plane has an off-angle of 5° in the direction of <000-1> from (10-10) plane.

The physical properties of a portion of the GaN self-supporting substrate 4' thus produced and located about 2 mm away from the original seed in the [11-24] direction were evaluated in the same way as in Example 1.

A reciprocal lattice map of the (100) plane when x-rays entered in a direction perpendicular to the a-axis was measured. In the Qx direction profile that includes a maximum intensity and is derived from an isointensity contour plot obtained by such mapping, the width at the foot of the peak (Qx width) was estimated.

The Qx widths at 1/300th and 1/1000th of the peak intensity were respectively $3.6\times10^{-4}$ (rlu) and $6.0\times10^{-4}$ (rlu), which were very small values.

As in the reciprocal lattice map measurement described above, the x-ray beam was made to enter from a direction perpendicular to the a-axis, and the (100) rocking curve (Open detector) was measured. The full width at half maximum of the peak intensity and the spectral widths at 1/300th and 1/1000th of the peak intensity were respectively 61.8 arc-sec, 338.4 arc-sec and 612.0 arc-sec.

Next, the GaN self-supporting plate 4' was rotated 90° about the m-axis as the center, the x-ray beam was made to enter from a direction perpendicular to the c-axis, and the (100) rocking curve (Open detector) was measured. The full width at half maximum of the peak intensity and the spectral widths at 1/300th and 1/1000th of the peak intensity were respectively 32.5 arc-sec, 194.4 arc-sec and 338.4 arc-sec.

The spectral width of (100) XRC when the x-ray beam entered from a direction perpendicular to the a-axis was divided by the spectral width of (100) XRC when the x-ray beam entered from a direction perpendicular to the c-axis, and the ratio of these was calculated. The ratio for the full width at half maximum of the peak intensity and the ratios for the spectral widths at 1/300th and 1/1000th of the peak intensity were respectively 1.90, 1.74 and 1.81, indicating that the anisotropy was small.

Also, an undoped GaN layer was grown to 1 μm by MOCVD on a GaN self-supporting substrate 4', and evaluation of the stacking fault density by cathodoluminescence (CL) measurement was carried out, yielding a result of $3\times10^2$/cm. The stacking faults observed by CL at the surface of the m-plane had lengths in the a-axis direction that were at least 200 μm.

Example 10: Crystal Growth Using Seed Crystals in which Substrate Sidewall was a Semi-Polar Plane Dicing from the GaN self-supporting substrates 2' produced by the manufacturing method described in Example 9 was carried out in such a way that a portion of the sidewall formed at the (11-24) plane (which coincides with the plane an angle of 39° with the (0001) plane). In this way, rectangular crystals measuring 3 mm in the <11-24> direction and 35 mm in the <11-20> (a-axis) direction and whose principal plane is the (10-10) plane were produced. Polishing was then carried out, producing rectangular GaN self-supporting substrates 3" having a thickness of 330 μm. Both ends of the GaN self-supporting substrates 3" were placed on PG plates lying on a susceptor 107 at intervals corresponding to the length of the long sides of the self-supporting substrates 3", and a GaN single-crystal film was grown by HVPE for 40 hours as described below.

In a mixed gas atmosphere in which the partial pressure of the $H_2$ carrier gas was $6.00\times10^2$ Pa, the partial pressure of the $N_2$ carrier gas was $8.29\times10^3$ Pa and the partial pressure of the $NH_3$ gas was $1.13\times10^4$ Pa, the temperature of the reaction chamber was raised to 1040° C. and held for 1 minute.

Growth of the GaN single-crystal film by HVPE was begun as described below.

After holding the temperature for 1 minute as mentioned above, the partial pressure of the GaCl gas was increased from 0 Pa to $3.54\times10^2$ Pa and the partial pressure of HCl gas was increased from 0 Pa to $6.00\times10^1$ Pa for 1 minute. The partial pressure of the $H_2$ carrier gas, after being held for 1 minute as mentioned above, was increased from $6.00\times10^2$ Pa to $4.00\times10^4$ Pa over 1 minute.

In the subsequent single-crystal growth step, the growth pressure to the end of growth was set to $1.01\times10^5$ Pa, the partial pressure of the GaCl gas was set to $3.54\times10^2$ Pa, and the partial pressure of the $NH_3$ gas was set to $1.13\times10^4$ Pa.

Following completion of the single-crystal growth step, the temperature was lowered to room temperature and a GaN crystal was obtained.

No abnormal growth was observed in the resulting GaN single crystals, which were crack-free. The growth thickness was about 4.3 mm in the m-axis direction (for the top and back faces combined) and about 7.0 mm in the [11-24] direction, Hence, in spite of the fact that the growth conditions were the same, differences in the growth rate depending on the planar orientation were confirmed. The growth rate in the [11-24] direction was 175 μm/hr, and was thus confirmed to be at least 1.5 times faster than the growth rate in the principal plane direction.

In a wing growth region of the resulting GaN crystal, an approximately 1.2 mm thick growth portion was sliced in a principal plane having a misorientation angle of 5° in the <000-1> direction from the (10-10) plane. The GaN crystal was further polished using a diamond abrasive and surface polished by chemical mechanical polishing (CMP), thereby producing a 400 μm thick free-standing GaN substrate 4" whose principal plane has an off-angle of 5° in the direction of <000-1> from (10-10) plane.

The physical properties of a portion of the GaN self-supporting substrate 4" thus produced and located about 5 mm away from the original seed in the [11-24] direction were evaluated in the same way as in Example 1.

A reciprocal lattice map of the (100) plane when x-rays entered in a direction perpendicular to the a-axis was measured. In the Qx direction profile that includes a maximum intensity and is derived from an isointensity contour plot obtained by such mapping, the width at the foot of the peak (Qx width) was estimated.

The Qx widths at 1/300th and 1/1000th of the peak intensity were respectively $3.68 \times 10^{-4}$ (rlu) and $7.10 \times 10^{-4}$ (rlu), which were very small values.

As in the reciprocal lattice mapping measurement described above, the x-ray beam was made to enter from a direction perpendicular to the a-axis, and the (100) rocking curve (Open detector) was measured. The full width at half maximum of the peak intensity and the spectral widths at 1/300th and 1/1000th of the peak intensity were respectively 109.6 arc-sec, 500.4 arc-sec and 936.0 arc-sec.

Next, the GaN self-supporting plate 4" was rotated 90°, the x-ray beam was made to enter from a direction perpendicular to the c-axis, and the (100) rocking curve (Open detector) was measured. The full width at half maximum of the peak intensity and the spectral widths at 1/300th and 1/1000th of the peak intensity were respectively 28.3 arc-sec, 216.0 arc-sec and 417.6 arc-sec.

The spectral width of (100) XRC when the x-ray beam entered from a direction perpendicular to the a-axis was divided by the spectral width of (100) XRC when the x-ray beam entered from a direction perpendicular to the c-axis, and the ratio of these was calculated. The ratio for the full width at half maximum of the peak intensity and the ratios for the spectral widths at 1/300th and 1/1000th of the peak intensity were respectively 3.88, 2.32 and 2.24, indicating that the anisotropy was small.

Also, an undoped GaN layer was grown to 1 μm by MOCVD on a GaN self-supporting substrate 4", and evaluation of the stacking fault density by cathodoluminescence (CL) measurement was carried out, yielding a result of $1.6 \times 10^3$/cm. The stacking faults observed by CL at the surface of the m-plane had lengths in the a-axis direction that were at least 200 μm.

Comparative Example 2

Crystal Growth Directly on Seed Crystal

A comparative GaN self-supporting substrate 3 having a rectangular shape measuring 5 mm in the <0001> (c-axis) direction and 25 mm in the <11-20> (a-axis) direction, and having the (10-10) plane as the principal plane and a thickness of 330 μm was produced from a (0001) plane bulk crystal obtained by the same method as in Example 9. The comparative GaN self-supporting substrate 3 was placed on a PG plate and, as described below, a GaN single-crystal film was grown by HVPE for 40 hours.

In a mixed gas atmosphere in which the partial pressure of the $N_2$ carrier gas was $8.29 \times 10^3$ Pa and the partial pressure of the $NH_3$ gas was $1.13 \times 10^4$ Pa, the temperature of the reaction chamber was raised to 1040° C. and held for 1 minute.

Growth of the GaN single-crystal film by HVPE was begun as described below.

After holding the temperature for 1 minute as mentioned above, the partial pressure of the GaCl gas was increased from 0 Pa to $3.54 \times 10^2$ Pa and the partial pressure of HCl gas was increased from 0 Pa to $3.48 \times 10^1$ Pa for 1 minute. The partial pressure of the $H_2$ carrier gas, after being held for 1 minute as mentioned above, was increased from 0 Pa to $8.22 \times 10^4$ Pa over 1 minute.

In the subsequent single-crystal growth step, the growth pressure to the end of growth was set to $1.01 \times 10^5$ Pa, the partial pressure of the GaCl gas was set to $3.54 \times 10^2$ Pa, and the partial pressure of the $NH_3$ gas was set to $1.13 \times 10^4$ Pa. Following completion of the single-crystal growth step, the temperature was lowered to room temperature and a GaN crystal was obtained.

No abnormal growth was observed in the resulting GaN single crystal directly on a seed crystal; the GaN single-crystal was crack-free. The growth thickness was about 4.3 mm in the m-axis direction (for the top and back faces combined).

A 1.2 mm thick growth portion of the resulting GaN crystal was sliced in a principal plane having a misorientation angle of 5° in the <000-1> direction from the (10-10) plane. The GaN crystal was further polished using a diamond abrasive and surface polished by chemical mechanical polishing (CMP), thereby producing a 400 μm thick free-standing GaN substrate 4 whose principal plane has an off-angle of 5° in the direction of <000-1> from (10-10) plane.

The physical properties of the GaN self-supporting substrate 4 thus produced were evaluated in the same way as in the working examples.

A reciprocal lattice map of the (100) plane of the comparative GaN self-supporting substrate 4 when x-rays entered in a direction perpendicular to the a-axis was measured. In the Qx direction profile that includes a maximum intensity and is derived from an isointensity contour plot obtained by such mapping, the width at the foot of the peak (Qx width) was estimated.

The Qx widths at 1/300th and 1/1000th of the peak intensity were respectively $2.57 \times 10^{-3}$ (rlu) and $4.7 \times 10^{-3}$ (rlu), which were very large values.

As in the reciprocal lattice mapping measurement described above, the x-ray beam was made to enter from a direction perpendicular to the a-axis, and the (100) rocking curve (Open detector) was measured. The full width at half maximum of the peak intensity and the spectral widths at 1/300th and 1/1000th of the peak intensity were respectively 154.4 arc-sec, 1782 arc-sec and 3420 arc-sec, which were very large values.

Next, the comparative GaN self-supporting plate 4 was rotated 90°, the x-ray beam was made to enter from a direction perpendicular to the c-axis, and the (100) rocking curve (Open detector) was measured. The full width at half maximum of the peak intensity and the spectral widths at 1/300th and 1/1000th of the peak intensity were respectively 32.5 arc-sec, 334.8 arc-sec and 514.8 arc-sec.

The spectral width of (100) XRC when the x-ray beam entered from a direction perpendicular to the a-axis was divided by the spectral width of (100) XRC when the x-ray beam entered from a direction perpendicular to the c-axis, and the ratio of these was calculated. The ratio for the full width at half maximum of the peak intensity and the ratios for the spectral widths at 1/300th and 1/1000th of the peak intensity were respectively 4.75, 5.32 and 6.64, indicating that the anisotropy was very large.

Also, an undoped GaN layer was grown to 1 μm by MOCVD on a GaN self-supporting substrate 4, and evaluation of the stacking fault density by cathodoluminescence (CL) measurement was carried out, yielding a result of $9.2 \times 10^4$/cm, which was a very large value. The stacking faults observed by CL at the surface of the m-plane had lengths in the a-axis direction that were at least 200 μm.

Reference Example

A reciprocal lattice map of the GaN self-supporting substrate 1 on which the above C-plane growth had been carried out was measured in the same way as for the GaN self-supporting substrate 2, and the width at the foot of the peak (Qx width) was estimated. The Qx widths at 1/300th and 1/1000th of the peak intensity were respectively $1.45 \times 10^{-4}$ (rlu) and $2.00 \times 10^{-4}$ (rlu), which were substantially the same values as those obtained for the GaN self-supporting substrate 2 in this example. A periodic table Group 13 metal nitride crystal that has been C-plane growth is a crystal without stacking faults. Hence, it can be appreciated that, although the periodic table Group 13 metal nitride crystal of the invention has been crystal-grown using a non-polar plane as the principal plane, the number of stacking faults has decreased. Moreover, it can be appreciated that this is a crystal which, along with a decrease in the number of stacking faults, has little crystal warpage.

The anisotropy of the x-ray rocking curve was measured for the GaN self-supporting substrate 1.

Measurement was carried out in the same way as in the working examples. When x-rays were made to enter perpendicular to the a-axis, the full width at half maximum of the peak intensity and the spectral widths at 1/300th and 1/1000th of the peak intensity were respectively 35.0 arc-sec, 194 arc-sec and 323 arc-sec.

When x-rays were made to enter perpendicular to the c-axis, the full width at half maximum of the peak intensity and the spectral widths at 1/300th and 1/1000th of the peak intensity were respectively 30.9 arc-sec, 176 arc-sec and 299 arc-sec.

The spectral width of (100) XRC when the x-ray beam entered from a direction perpendicular to the a-axis was divided by the spectral width of (100) XRC when the x-ray beam entered from a direction perpendicular to the c-axis, and the ratio of these was calculated. The ratios for the full width at half maximum of the peak intensity and ratios for the spectral widths at 1/300th and 1/1000th of the peak intensity were respectively 1.13, 1.10 and 1.10.

This application claims priority from Japanese Patent Application No. 2012-081735 and Japanese Patent Application No. 2012-082153, filed on Mar. 30, 2012, the entire contents of which are incorporated herein by reference.

While the invention has been described in detail and with reference to specific embodiments thereof, it will be apparent to one skilled in the art that various changes and modifications can be made therein without departing from the spirit and scope thereof.

EXPLANATION OF REFERENCE NUMERALS

100 Reactor
101 Carrier gas introducing pipe
102 Dopant gas introducing pipe
103 Group 13 starting material reservoir introducing pipe
104 Nitrogen source introducing pipe
105 Group 13 starting material reservoir
106 Heaters
107 Susceptor
108 Exhaust pipe
109 Base substrate
G1 Carrier gas
G2 Dopant gas
G3 Group 13 source gas
G4 Nitrogen source gas

The invention claimed is:

1. A gallium nitride single-crystal substrate having a thickness of 0.2 mm or more and comprising a gallium nitride crystal grown on a non-polar or semi-polar plane of a gallium nitride,
wherein, in a Qx direction intensity profile that includes a maximum intensity and is derived from an isointensity contour plot obtained by x-ray reciprocal lattice mapping of a (100) plane of the gallium nitride crystal, a Qx width at 1/300th of peak intensity is $6 \times 10^{-4}$ rlu or less.

2. The substrate according to claim 1, wherein, in a Qx direction intensity profile that includes a maximum intensity and is derived from an isointensity contour plot obtained by x-ray reciprocal lattice mapping of (100) plane of the gallium nitride crystal, a Qx width at 1/1000th of peak intensity is $1 \times 10^{-3}$ rlu or less.

3. The substrate according to claim 1, wherein the number of stacking faults visible in cathodoluminescence imaging is $3 \times 10^3$/cm or less.

4. The substrate according to claim 1, wherein a c-axis misorientation angle distribution at a distance of 40 mm is within ±0.5°.

5. The substrate according to claim 1, which is a gallium nitride single-crystal self-supporting substrate.

6. The substrate according to claim 1, wherein the gallium nitride single-crystal substrate thickness is 0.3 mm or more.

7. The substrate according to claim 1, wherein the gallium nitride single-crystal substrate thickness is 0.4 mm or more.

8. The substrate according to claim 1, comprising a gallium nitride crystal grown on a non-polar plane of the gallium nitride.

9. The substrate according to claim 8, wherein the gallium nitride crystal is grown by hydride vapor-phase epitaxy.

10. The substrate according to claim 1, comprising a gallium nitride crystal grown on a semi-polar plane of the gallium nitride.

11. The substrate according to claim 10, wherein the gallium nitride crystal is grown by hydride vapor-phase epitaxy.

12. The substrate according to claim 1, wherein the gallium nitride crystal is grown by hydride vapor-phase epitaxy.

13. The substrate according to claim 1, wherein the Qx width at 1/300th of peak intensity is $4\times10^{-4}$ rlu or less.

14. The substrate according to claim 1, wherein the Qx width at 1/300th of peak intensity is $3\times10^{-4}$ rlu or less.

15. The substrate according to claim 1, wherein the number of stacking faults visible in cathodoluminescence imaging is not more than $1\times10^{3}$/cm.

16. The substrate according to claim 1, wherein the number of stacking faults visible in cathodoluminescence imaging is not more than $2\times10^{2}$/cm.

17. A semiconductor device comprising the substrate according to claim 5.

* * * * *